US011454682B2

(12) United States Patent
Gerginov et al.

(10) Patent No.: US 11,454,682 B2
(45) Date of Patent: Sep. 27, 2022

(54) OPTICALLY PUMPED MAGNETOMETERS FOR COMMUNICATION RECEPTION

(71) Applicant: The Regents of the University of Colorado, a body corporate, Denver, CO (US)

(72) Inventors: Vladislav Gerginov, Boulder, CO (US); Fabio da Silva, Westminster, CO (US)

(73) Assignees: The Regents of the University of Colorado, a body corporate, Denver, CO (US); Government of the United States of America, as represented by the Secretary of Commerce, Gaithersburg, MD (US)

( * ) Notice: Subject to any disclaimer, the term of this patent is extended or adjusted under 35 U.S.C. 154(b) by 170 days.

(21) Appl. No.: 16/572,409

(22) Filed: Sep. 16, 2019

(65) Prior Publication Data

US 2020/0088813 A1 Mar. 19, 2020

Related U.S. Application Data

(60) Provisional application No. 62/731,582, filed on Sep. 14, 2018.

(51) Int. Cl.
*G01R 33/26* (2006.01)

(52) U.S. Cl.
CPC .................... *G01R 33/26* (2013.01)

(58) Field of Classification Search
CPC .................................................... G01R 33/26
See application file for complete search history.

(56) References Cited

U.S. PATENT DOCUMENTS

| | | | |
|---|---|---|---|
| 7,038,450 B2 | 5/2006 | Romalis et al. | |
| 7,521,928 B2 | 4/2009 | Romalis et al. | |
| 8,212,556 B1 | 7/2012 | Schwindt et al. | |
| 8,373,413 B2 | 2/2013 | Sugioka | |
| 8,780,948 B2 | 7/2014 | Wilkinson et al. | |
| 9,614,589 B1 | 4/2017 | Russo et al. | |
| 9,726,733 B2 | 8/2017 | Smith et al. | |
| 10,353,270 B2 | 7/2019 | Perrella et al. | |

(Continued)

OTHER PUBLICATIONS

Gerginov et al., Prospects For Magnetic Field Communications and Location Using Quantum Sensors, Review of Scientific Instruments, vol. 88, pp. 125005-1-125005-10. (Year: 2017).*

(Continued)

*Primary Examiner* — Susan S Lee

(57) ABSTRACT

Various embodiments of the present technology use low-frequency magnetic signals for communication and location applications. Compared to the case of traditionally used radio-frequency electromagnetic signals, their advantage in the presence of strong signal attenuation is in the extended spatial range. Some embodiments use an optically pumped atomic magnetometer operated as a sensor to achieve high detection sensitivity. The spatial range can be extended to hundreds of meters when noise is suppressed by the use of the available sensor sensitivity. In some embodiments, a one-channel spread-spectrum signal processing technique can be used to eliminate the systematic fluctuations coming from power grid (or another source) harmonics and reduce the ambient noise by averaging uncorrelated fluctuations from the environment.

20 Claims, 13 Drawing Sheets

(56) References Cited

U.S. PATENT DOCUMENTS

| | | |
|---|---|---|
| 2010/0090697 A1 | 4/2010 | Savukov et al. |
| 2010/0219827 A1 | 9/2010 | Matlashov et al. |
| 2010/0289491 A1 | 11/2010 | Budker et al. |
| 2017/0207823 A1* | 7/2017 | Russo .................. H04B 5/0031 |
| 2020/0018802 A1* | 1/2020 | Palacios Laloy ...... G01R 33/26 |

OTHER PUBLICATIONS

Gerginov, V. et al., "Two-Photon Optical Frequency Reference With Active ac Stark Shift Cancellation," Physical Review Applied, vol. 10, pp. 014031-1-014031-8, Jul. 30, 2018.

Martin, Kyle W. et al., "Compact Optical Atomic Clock Based On A Two-Photon Transition In Rubidium," Physical Review Applied, vol. 9, pp. 014019-1-014019-10, Jan. 18, 2018.

Martin, Kyle W. et al., "Frequency Shifts Due To Stark Effects On A Rubidium Two-Photon Transition," Physical Review A, vol. 100, pp. 023417-1-023417-11, Aug. 28, 2019.

Perrella, C. et al., "Two-Color Rubidium Fiber Frequency Standard," Optics Letters, vol. 38, No. 12, pp. 2122-2124, Jun. 15, 2013.

Shirley, Jon H., "Modulation Transfer Processes In Optical Heterodyne Saturation Spectroscopy," Optics Letters, vol. 7, No. 11, pp. 537-539, Nov. 1982.

Telle, H. R. et al., "Kerr-Lens, Mode-Locked Lasers As Transfer Oscillators For Optical Frequency Measurements," Applied Physics B, vol. 74, pp. 1-6, 2002.

Aharoni, Amikam, "Demagnetizing Factors For Rectangular Ferromagnetic Prisms," Journal of Applied Physics, vol. 33, No. 6, pp. 3432-3434, Mar. 15, 1998.

Akyildiz, Ian F. et al., "Realizing Underwater Communication Through Magnetic Induction," IEEE Communications Magazine, pp. 42-48, Nov. 2015.

Allan, David W., "Time And Frequency (Time-Domain) Characterization, Estimation, And Prediction Of Precision Clocks And Oscillators," IEEE Transactions on Ultrasonics, Ferroelectrics, and Frequency Control, vol. UFFC-34, No. 3, pp. 647-654, Nov. 1987.

Bell, William E. et al., "Observation Of Forbidden Resonances In Optically Driven Spin Systems," Physical Review Letters, vol. 6, No. 11, pp. 623-624, Jun. 1, 1961.

Bevilacqua, Guiseppe et al., "Multichannel Optical Atomic Magnetometer Operating In Unshielded Environment," Applied Physics B., vol. 122, 9 pages, Apr. 12, 2016.

Boto, Elena et al., "A New Generation Of Magnetoencephalography: Room Temperature Measurements Using Optically-Pumped Magnetometers," NeuroImage, No. 149, pp. 404-414, Jan. 25, 2017.

Budker, Dmitry et al., "Optical Magnetometry," Nature Physics, vol. 3, pp. 227-234, Apr. 2007.

Chen, Du-Xing et al., "Demagnetizing Factors For Cylinders," IEEE Transactions on Magnetics, vol. 27, No. 4, pp. 3601-3619, Jul. 1991.

Chen, Yicheng et al., "Low Power Near Field Communication Methods For RFID Applications Of SIM Cards," Sensors, vol. 17, 14 pages, Apr. 14, 2017.

Clarke, John, "SQUIDs: Then And Now," International Journal of Modern Physics B, vol. 24, Nos. 20 and 21, pp. 3999-4038, 2010.

Constable, Catherine, "Earth's Electromagnetic Environment," Surv Geophys, vol. 37, pp. 27-45, 2016.

Cooper, Robert J. et al., "Atomic Magnetometer Multisensor Array For rf Interference Mitigation And Unshielded Detection Of Nuclear Quadrupole Resonance," Physical Review Applied, vol. 6, pp. 064014-1-064014-14, Dec. 27, 2016.

Deans, Cameron et al., "Electromagnetic Induction Imaging With A Radio-Frequency Atomic Magnetometer," Applied Physics Letters, vol. 108, pp. 103503-1-103503-5, Mar. 10, 2016.

Dupont-Roc, J et al., "Detection Of Very Weak Magnetic Fields (10-9 Gauss) By 87Rb Zero-Field Level Crossing Resonances," Physics Letters, vol. 28A, No. 9, pp. 638-639, Feb. 10, 1969.

Gerginov, V et al., "Prospects For Magnetic Field Communications And Location Using Quantum Sensors," Review of Scientific Instruments, vol. 88, pp. 125005-1-125005-10, Dec. 14, 2017.

Gerginov, Vladislav et al., "Pulsed Operation Of A Miniature Scalar Optically Pumped Magnetometer," Journal of the Optical Society of America B, vol. 34, No. 7, pp. 1429-1434, Jul. 2017.

Goodman, William L. et al., "Superconducting Instrument Systems," Proceedings of the IEEE, vol. 61, No. 1, pp. 20-27, Jan. 1973.

Giffith, W. Clark et al., "Miniature Atomic Magnetometer Integrated With Flux Concentrators," Applied Physics Letters, vol. 94, pp. 023502-1-023502-3, Jan. 14, 2009.

Guedes, A. et al., "Improving Magnetic Field Detection Limits Of Spin Valve Sensors Using Magnetic Flux Guide Concentrators," IEEE Transactions on Magnetics, vol. 43, No. 6, pp. 2376-2378, Jun. 2007.

Johnson, Cort et al., "Magnetoencephalography With A Two-Color Pump-Probe, Fiber-Coupled Atomic Magnetometer," Applied Physics Letters, vol. 97, pp. 243703-1-243703-3, Dec. 17, 2010.

Johnson, J. B., "Thermal Agitation Of Electricity In Conductors," Physical Review, vol. 32, pp. 97-109, Jul. 1928.

Ledbetter, M. P. et al., "Optical Detection Of NMR J-Spectra At Zero Magnetic Field," Journal of Magnetic Resonance, vol. 199, pp. 25-29, Mar. 28, 2009.

Marmugi, Luca et al., "Remote Detection Of Rotating Machinery With A Portable Atomic Magnetometer," Applied Optics, vol. 56, No. 3, pp. 743-749, Jan. 20, 2017.

Ness, Norman F. et al., "Use Of Two Magnetometers For Magnetic Field Measurements On A Spacecraft," Journal of Geophysical Research, vol. 76, No. 16, pp. 3564-3573, Jun. 1, 1971.

NIST, Logbook, pp. 84-85, Apr. 25, 2017.

Osborn, J. A., "Demagnetizing Factors Of The General Ellipsoid," Physical Review, vol. 67, Nos. 11 and 12, pp. 351-357, Jun. 1 and 15, 1945.

Ripka, Pavel et al., "Advances In Magnetic Field Sensors," IEEE Sensors Journal, vol. 10, No. 6, pp. 1108-1116, Jun. 2010.

Sander, T. H. et al., "Magnetoencephalography With A Chip-Scale Atomic Magnetometer," Biomedical Optics Express, vol. 3, No. 5, pp. 981-990, May 1, 2012.

Savukov, I. M. et al., "Detection Of NMR Signals With A Radio-Frequency Atomic Magnetometer," Journal of Magnetic Resonance, vol. 185, pp. 214-220, 2007.

Savukov, I. M. et al., "NMR Detection With An Atomic Magnetometer," Physical Review Letters, vol. 94, pp. 123001-1-123001-4, Mar. 29, 2005.

Savukov, I. M. et al., "Tunable Atomic Magnetometer For Detection Of Radio-Frequency Magnetic Fields," Physical Review Letters, vol. 95, pp. 063004-1-063004-4, Aug. 3, 2005.

Schwindt, Peter D. D. et al., "Chip-Scale Atomic Magnetometer," Applied Physics Letters, vol. 85, No. 26, pp. 6409-6411, Dec. 27, 2004.

Seltzer, S. J. et al., "Unshielded Three-Axis Vector Operation Of A Spin-Exchange-Relaxation-Free Atomic Magnetometer," Applied Physics Letters, vol. 85, No. 20, pp. 4804-4806, Nov. 15, 2004.

Shah, V. et al., "High Bandwidth Atomic Magnetometery With Continuous Quantum Nondemolition Measurements," Physical Review Letters, vol. 104, pp. 013601-1-013601-4, Jan. 5, 2010.

Shannon, Claude E., "Communication In The Presence Of Noise," Proceedings of the I.R.E., pp. 10-21, Jan. 1949.

Sheng, D. et al., "A Microfabricated Optically-Pumped Magnetic Gradiometer," Applied Physics Letters, vol. 110, pp. 031106-1-031106-4, Jan. 18, 2017.

Sheng, D. et al., "Subfemtotesla Scalar Atomic Magnetometry Using Multipass Cells," Physical Review Letters, vol. 110, pp. 160802-1-160802-5, Apr. 18, 2013.

Slack, Howard A. et al., "The Geomagnetic Gradiometer," Geophysics, vol. XXXII, No. 5, pp. 877-892, Oct. 1967.

Smullin, S. J. et al., "Low-Noise High-Density Alkali-Metal Scalar Magnetometer," Physical Review A, vol. 80, pp. 033420-1-033420-10, Sep. 29, 2009.

Wickerham, W. E., "The Gulf Airborne Magnetic Gradiometer," Annual Meeting of the Society, pp. 116-123, Mar. 26, 1952.

(56) References Cited

OTHER PUBLICATIONS

Xia, H. et al., "Magnetoencephalography With An Atomic Magnetometer," Applied Physics Letters, vol. 89, pp. 211104-1-211104-3, Nov. 21, 2006.

Yenchek, Michael R. et al., "NIOSH-Sponsored Research In Through-The-Earth Communications For Mines: A Status Report," IEEE Transactions on Industry Applications, vol. 48, No. 5, pp. 1700-1707, Sep./Oct. 2012.

* cited by examiner

OPTICALLY PUMPED MAGNETOMETERS FOR COMMUNICATION RECEPTION

CROSS-REFERENCE TO RELATED APPLICATIONS

This application claims priority to U.S. Provisional Application Ser. No. 62/731,582 filed Sep. 14, 2019, which is incorporated herein by reference in its entirety for all purposes.

STATEMENT REGARDING FEDERALLY SPONSORED RESEARCH

This invention was made with government support under grant number 70NANB14H095 awarded by NIST. The government has certain rights in the invention.

TECHNICAL FIELD

Various embodiments of the present technology generally relate to applications of optically pumped magnetometers. More specifically, some embodiments relate to communicating information via magnetic fields received by optically pumped magnetometers that use the effects of light-induced transitions between atomic energy levels (leading to optical pumping) and the optical detection of the energy levels' dependence on magnetic field strength.

BACKGROUND

Communications and location technologies are based primarily on the generation, transmission, and reception of electromagnetic signals. In certain cases, the environment can distort, attenuate, or even completely prevent the signals from propagating between the transmitter and sensor. Specifically, alternating current (AC) electromagnetic fields experience high attenuation in metals, solid materials (e.g., concrete, rock, soil, etc.), water and other conductive materials.

The electromagnetic field propagating through a given material is attenuated exponentially with the skin depth $\delta$, given by the expression, $\delta = (\pi f \mu_r \mu_0 \sigma)^{-1/2}$, where f is the field frequency, $\mu_0 = 4\pi \ast 10^{-7}$ is the magnetic constant, $\mu_r$ is the relative magnetic permeability of the material, and $\sigma$ is the material conductivity. According to this expression, the skin depth in the same material is three orders of magnitude smaller for f=1 GHz signal versus f=1 kHz. This shows the advantage of using low-frequency signals in the presence of strong medium absorption. For example, signal attenuation inside buildings, underground, or in water makes the conventional methods of communication and location, based on high-frequency transmission and reception, impractical or impossible.

Unfortunately, the use of low frequencies comes at the price of reduced bandwidth (BW), leading to limited communication channel capacity and location accuracy. Another drawback is the long wavelength of the signal, and the large characteristic size of the antennae used for the most efficient RF link between transmitters and sensors, even when induction coils with ferrite cores are used to boost the signal above the thermal background. An example of using low-frequency electromagnetic fields is the Ultra-Low Frequency (ULF) submarine communications system, the only successfully deployed underwater electromagnetic application.

Low-frequency magnetic fields also have a dipole nature, and the field strength drops with the third power of the distance reciprocal 1/r (with r large compared to the dipole source size), thus reducing the signal range. For certain applications, the short signal range is useful as the short signal range allows multiple transmitters to be operated in close proximity without creating significant interference problems and is the reason why local magnetic signal communications have recently attracted attention, for example, for near-field magnetic field communication and Radio-frequency Identification (RFID) tagging.

SUMMARY

Systems and methods are described for communicating information via magnetic fields received by optically pumped magnetometers that use the effects of light-induced transitions between atomic energy levels (leading to optical pumping) and the optical detection of the energy levels' dependence on magnetic field strength. Some embodiments provide for a system comprising a processor, an optically pumped magnetometer (OPM), and a decoder. The OPM can be configured to sense a modulated magnetic field that includes encoded information. The magnetic field can have its phase, frequency, polarization or amplitude modulated (i.e., its physical parameters can be modulated). The modulation can be analog or digital.

The encoder can be communicably coupled to the OPM and configured to decode an output of the OPM to identify the encoded information transmitted via the modulated magnetic field. In some embodiments, the processor can cause the OPM to switch back and forth from a total field to a field component OPM sensor. The processor may also be configured to identify vector properties of the modulated magnetic field and ambient magnetic field noise. The OPM, in some embodiments, can include, concentrators to enhance performance only when an OPM baseline is below a concentrated received signal and above a concentrated ambient noise. The processor may be a digital signal processor in some embodiments and may be further configured to filter out and/or average noise components in a spectral domain of the modulated magnetic field as represented by the output of the OPM.

Some embodiments provide for methods of wirelessly communicating information. In some embodiments, an optically pumped magnetometer (OPM) can be enabled to sense a modulated magnetic field that includes encoded information. The modulated magnetic field may be phase modulated, polarization modulated, amplitude modulated, frequency modulated, analog modulated, digitally modulated, and/or the like. An output of the OPM can be decoded to identify the encoded information transmitted via the modulated magnetic field.

In some embodiments, the modulated magnetic field is modulated with a binary phase-shift keying scheme, a pseudo-random code at a chip rate, or the like. The pseudo-random code can be selected to have zero amplitude frequency notches at an interference frequency. For example, the interference frequency can be a power grid frequency is 60 Hertz or 50 Hertz.

In some embodiments, a communication system may include a transmitter and a receiver. The transmitter can be configured to transmit a modulated magnetic field with encoded information. The receiver can include an optically pumped magnetometer (OPM) to detect the modulated magnetic field transmitted from the transmitter. The OPM can translate the modulated magnetic field into an electrical signal representing the sensed signal. A decoder can be configured to receive the electrical signal from the OPM and decode the encoded information. In some embodiments, the receiver can cause the OPM to switch back and forth from a total field to a field component OPM sensor to identify vector properties of the modulated magnetic field and ambient magnetic field noise. The OPM can include one or more concentrators, in some embodiments, to enhance performance only when an OPM baseline is below a concentrated received signal and above a concentrated ambient noise. In some embodiments, the receiver can include a digital signal processor to filter out and/or average noise components in a spectral domain of the modulated magnetic field as represented by the electrical signal from the OPM.

While multiple embodiments are disclosed, still other embodiments of the present technology will become apparent to those skilled in the art from the following detailed description, which shows and describes illustrative embodiments of the technology. As will be realized, the technology is capable of modifications in various aspects, all without departing from the scope of the present technology. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

Figure 1:
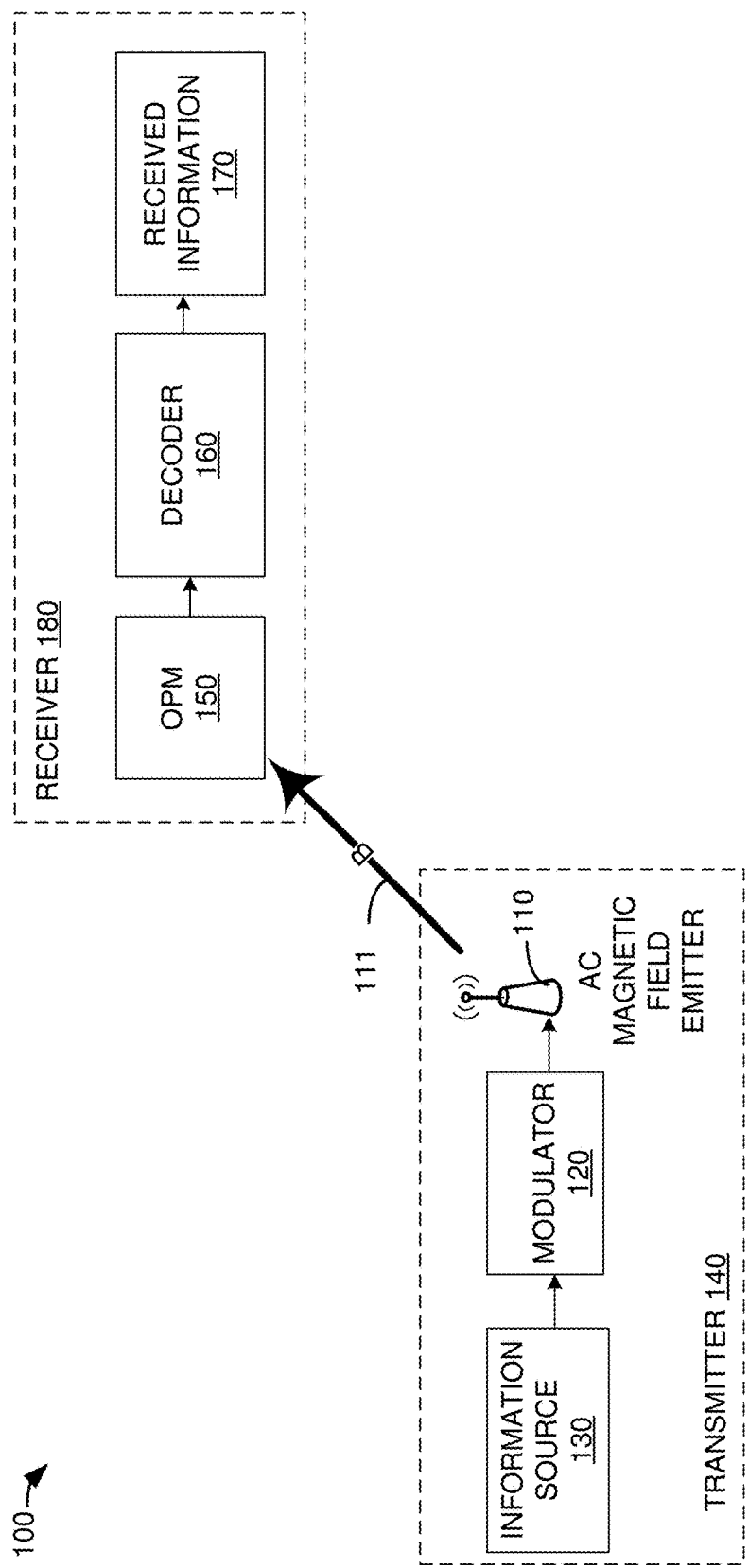
FIG. 1 is an illustration of a magnetic signal communication system in accordance with one or more embodiments of the present technology.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally relate to applications of optically pumped magnetometers (OPM). More specifically, some embodiments relate to communicating information via AC magnetic fields received by an optically pumped atomic magnetometer. Magnetic field detection covers an enormous spectrum of applications—scientific, medical, military, and space. The range of magnetic field strengths in different applications spans fifteen orders of magnitude—from Tesla fields used in nuclear magnetic resonance (NMR) and magnetic resonance imaging (MRI) experiments to femtoTesla ($10^{-15}$ T) fields generated by the brain activity.

Some magnetometer applications are limited to the detection of naturally occurring magnetic signals, and the use of magnetic signals to transfer information has been limited, mostly due to the short signal range of magnetic signals, the low frequency, and the presence of ambient noise. Examples of the use of magnetic signals for communication are through-the-Earth, near-field magnetic induction, under-water, and even through the human body communications. The navigation examples concern Global Positioning System (GPS)-denied environments and are based on either passive methods using "world maps" (Earth's field) or active ones using artificially created fields.

In contrast, various embodiments of the present technology provide systems and methods to extend the range of low-frequency magnetic field signals by significantly increasing the sensitivity of the magnetic field sensors and by efficiently using their bandwidth. The highest magnetic field sensitivity has been demonstrated by Superconducting Quantum Interference Devices (SQUIDs) and optically pumped magnetometers (OPMs), both reaching noise floors below 1 fT/Hz$^{1/2}$. The OPMs have the advantage of room-temperature operation, small size, and low power and cost. They achieve orders of magnitude better sensitivities than same-footprint induction coils, and can be operated in an unshielded environment at sensitivities significantly below the ambient magnetic field noise level. Magnetometers configured to detect alternating (AC) magnetic fields in the MHz range find use in applications such as NMR, MRI, magnetic induction imaging and AC magnetic signature of machinery. Chip-scale devices have been developed and are being used in biomedical research and low-field NMR. Magnetometers with noise floors below 10 fT/Hz$^{1/2}$ and footprints of 14 mm×21 mm×80 mm and 19 mm×27 mm×60 mm recently became commercially available.

Some embodiments include an OPM-based, single-channel, low data rate RF communication link and a link budget using a binary phase shift keying (BPSK) modulation scheme. These embodiments of the sensor have demonstrated a noise floor of below 1 pT/Hz$^{1/2}$ (significantly below the typical level of ambient magnetic field noise) in either a scalar or a vector sensor mode which requires no hardware modification. In addition, phase-sensitive detection of AC magnetic field signals with magnitude at the picotesla ($10^{-12}$ T) level and frequencies below 1 kHz has been successfully demonstrated for some embodiments. The BPSK modulation technique used in various embodiments fully utilizes the sensor bandwidth of ~1 kHz to suppress the ambient noise at 60 Hz and its harmonics and to increase the channel capacity. Finally, communication and location ranging limits using low-frequency magnetic signal transmission can be estimated using a link calculation analysis in some embodiments.

It should be understood as referenced herein, unless specifically referenced to a single type, the term optically pumped magnetometer (OPM) is intended to encompass both common classes of optically-pumped atomic magnetometers: (1) the direct current (DC) version, often simply called a "scalar-", or "total field-optically-pumped atomic magnetometer" (OPM) (typical frequency range of DC to <10 kHz); and (2) the alternating current (AC) version, often simply called "radio-frequency (RF) optically-pumped atomic magnetometer" (typical frequency range of 10 kHz to >1 MHz). In some embodiments, the OPM uses light to measure the effect a magnetic field has on the atomic structure of atoms such as alkali atoms (potassium, rubidium, cesium) or noble gases (helium). The light is used for 1) to prepare the internal states of the atoms; 2) to measure the effect of the magnetic field intensity or temporal intensity change on the atomic structure or the internal states of the atoms 3) both to prepare the internal states of the atoms and to measure the effect of the magnetic field intensity or temporal intensity change on the atomic structure or the internal states of the atoms.

In some embodiments, information can be wirelessly communicated by enabling an OPM to sense an AC magnetic field. An output of the OPM is then demodulated to receive information communicated via the AC magnetic field. In some embodiments, an AC magnetic field can be emitted that is modulated to communicate information (magnetic signal). The magnetic signal can be communicated wirelessly, and an optically pumped magnetometer (OPM) can be enabled to sense the magnetic signal. An output of the OPM can be demodulated to receive the information communicated via the magnetic signal.

Various embodiments of the present technology can enable communications and mapping in locations where GPS and ordinary cellphones and radios don't work reliably or even at all, such as indoors, in urban canyons, underwater and underground. For example, the technology may help mariners, soldiers, surveyors, and first responders among others. GPS signals don't penetrate very deeply or at all in water, soil or building walls, and therefore, can't be used by submarines or in underground activities such as surveying mines or rescue operations. GPS also may not work well indoors or even outdoors among city skyscrapers. For soldiers, radio signals may be blocked in environments cluttered by rubble or many interfering electromagnetic devices during military or disaster recovery missions.

Some embodiments use very low frequency (VLF) digitally modulated magnetic signals—which can travel farther through building materials, water and soil than conventional electromagnetic communications signals at higher frequencies. VLF electromagnetic fields are already used underwater in submarine communications. But there's not enough data-carrying capacity for audio or video, just one-way texts. Submarines also must tow cumbersome antenna cables, slow down and rise to periscope depth (18 meters, or about 60 feet, below the surface) to communicate. The big issues with very low-frequency communications, including magnetic radio, is poor receiver sensitivity and extremely limited bandwidth of existing transmitters and receivers. The best magnetic field sensitivity is obtained using quantum sensors. The increased sensitivity leads in principle to longer communications range. The quantum approach also offers the possibility to get high bandwidth communications like a cellphone has.

Some embodiments of the present technology can encode information within the magnetic signals. For example, some transmitters can create digitally modulated magnetic signals, that is, messages consisting of digital bits 0 and 1. For example, the modulated phase or frequency changes the horizontal position of a waveform while the amplitude changes the vertical position of the waveform.

The quantum method used in various embodiments is more sensitive than conventional magnetic sensor technology and could be used to communicate better. A signal processing technique can be used in some embodiments to reduce environmental magnetic noise, such as from the electrical power grid, which otherwise limits the communications range. This means receivers can detect weaker signals and the signal range can be increased. For example, some embodiments can use a direct-current (DC) magnetometer in which polarized light is used as a detector to measure the "spin precession" of atoms (e.g., rubidium) induced by magnetic fields. The atoms are confined in a tiny (typically glass) container. Changes in the atoms' spin rate correspond to changes in the DC magnetic fields, creating changes to the light's polarization which, after detection, generates alternating current (AC) electronic signals, or voltages at the light detector, which are more useful for communications. Such "optically pumped" magnetometers, in addition to high sensitivity, offer advantages such as room-temperature operation, small size, low power and cost, and reduced electromagnetic interference outside their bandwidth. A sensor of this type would not drift or require calibration as the spin precession is uniquely determined by the internal atomic structure of the used atoms.

Various embodiments of the sensor detected signals significantly weaker than typical ambient magnetic-field noise. The sensor detected digitally modulated magnetic field signals with strengths of 1 picotesla (one millionth of the Earth's magnetic field strength) and at very low frequencies, below 1 kilohertz (kHz). (This is below the frequencies of VLF radio, which spans 3 kHz-30 kHz and is used for some government and military services.) The modulation techniques suppressed the ambient noise and its harmonics, or multiples, effectively increasing the channel capacity.

Various embodiments also provide techniques to estimate communication and location-ranging limits. The spatial range of some embodiments could extend to hundreds of meters if the noise were reduced to the sensitivity levels of the sensor. Pinpointing location is more challenging. Position is derived from propagation delays, with 10 nanoseconds of propagation delay in free space corresponding to 3 meters position accuracy. The measured uncertainty in OPM location capability was 16 meters, much higher than the target of 3 meters, but this metric can be improved through future noise suppression techniques, increased sensor bandwidth, and improved digital algorithms that can accurately extract distance measurements. The researchers hope to extend the range of low-frequency magnetic field signals by boosting the sensor sensitivity, suppressing noise more effectively, and increasing and efficiently using the sensor's bandwidth.

In the following description, for the purposes of explanation, numerous specific details are set forth in order to provide a thorough understanding of embodiments of the present technology. It will be apparent, however, to one skilled in the art that embodiments of the present technology may be practiced without some of these specific details.

The techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions that may be used to program a computer (or other electronic devices) to perform a process. The machine-readable medium may include, but it not limited to: floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

FIG. 1 is an illustration of magnetic signal communication system 100 that may be used in accordance with various embodiments of the present technology. In the embodiments illustrated in FIG. 1, communication system 100 comprises AC magnetic field emitter 110, modulator 120, and information source 130 which can be part of a transmitter 140. While not illustrated in FIG. 1, transmitter 140 can include other components such as processors, encryption modules, power supplies, oscillators, amplifiers, and/or other components. Transmitter 140 can be a traditional transmitter configured to convey encoded information via a magnetic signal. In other embodiments transmitter 140 can be a specially designed transmitter to take advantage of characteristics of an OPM-based receiver.

The communication system 100 illustrated in FIG. 1, can also include optically pumped magnetometer 150 (that may be an optically-pumped atomic magnetometer or a radio-frequency (RF) optically-pumped atomic magnetometer), decoder 160 to decode information included in magnetic waves 111 into received information 170. These components may be part of receiver 180 as illustrated in FIG. 1. While not illustrated in FIG. 1, receiver 180 can include other components such as processors, encryption modules, power supplies, oscillators, amplifiers, data store devices, and/or other components.

In some embodiments, information source 130 can provide information (e.g., binary bits or analog waveforms) to modulator 120. Modulator 120 can apply a modulation scheme (and optionally a coding scheme) to the information from information source 130. For example, modulator 120 may apply a phase-shift keying or spread-spectrum modulation scheme to the information from information source 130. The modulated information is provided to AC magnetic field emitter 110. AC magnetic field emitter 110 can emit a time-varying magnetic signal via (at least) magnetic waves 111. Magnetic waves 111 pass through and are detected by OPM 150. In some embodiments, OPM 150 can detect an attenuated (and noise added) time-varying magnetic signal emitted by AC magnetic field emitter 110.

The output of OPM 150 is likewise a time-varying signal. The time varying signal output by OPM 150 can be decoded (e.g., by extracting information or code that has been introduced to the transmitted field with the purpose of sending information by decoder 160. The output of decoder 160 can be received information 170 which corresponds to the information provided by information source 130. Thus, magnetic waves 111 have been received by OPM 150 in order to receive information 170.

Figure 2:
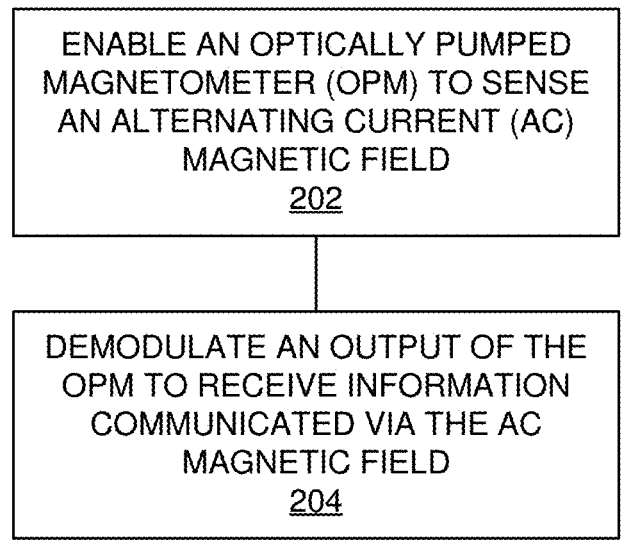
FIG. 2 is a flowchart illustrating an example of a set of operations for receiving information communicated via an AC magnetic signal, using an optically pumped magnetometer (OPM) in accordance with some embodiments of the present technology.

FIG. 2 is a flowchart 200 illustrating an example of a set of operations for receiving information communicated via a magnetic wave. The operations illustrated in FIG. 2 may be performed by one or more elements of communication system 100, and/or its components. In the embodiments illustrated in FIG. 2, an optically pumped magnetometer is enabled to sense an alternating current (AC) magnetic field (202). For example, OPM 150 may be biased by a direct current (DC) bias magnetic field to be made sensitive to alternating magnetic fields at a certain frequency (e.g., at a Larmor precession frequency.)

An output of the OPM can be demodulated to receive information communicated via the AC magnetic field (magnetic signal) (204). For example, a time-varying pump or probe beam characteristic (e.g., light power or light polarization direction) that has passed through the OPM 150 vapor cell may be demodulated by decoder 160 in order to receive the information 170 placed on a modulated magnetic field 111.

Figure 3:
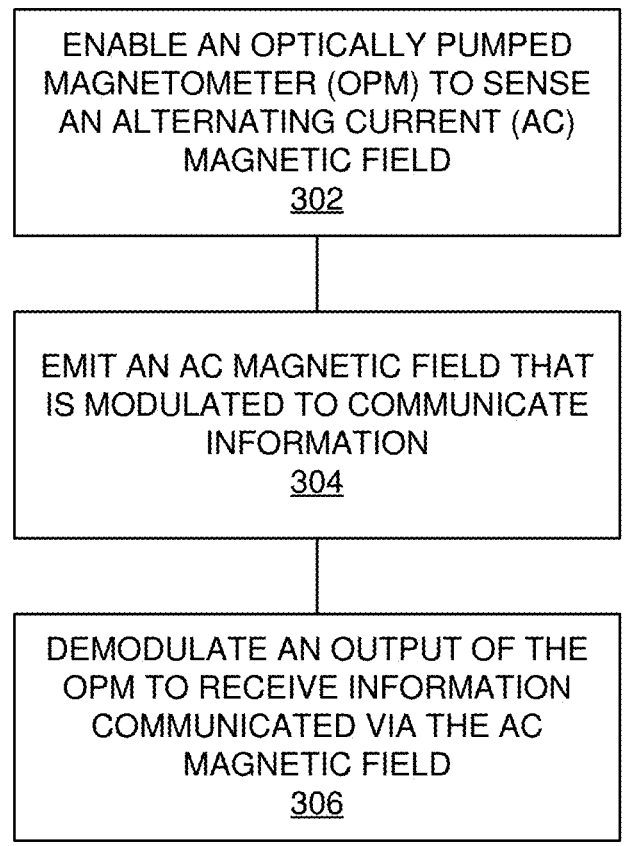
FIG. 3 is a flowchart illustrating an example of a set of operations for operating a magnetic signal communication system in accordance with various embodiments of the present technology.

FIG. 3 is a flowchart 300 illustrating an example of a set of operations for operating a magnetic signal communication system. The operations illustrated in FIG. 3 may be performed by one or more elements of communication system 100, and/or its components. In the embodiments illustrated in FIG. 3, an optically pumped magnetometer can be enabled to sense an alternating current (AC) magnetic field (302). As with the discussion of FIG. 1, the optically pumped magnetometer (OPM) may be an optically-pumped atomic magnetometer or a radio-frequency (RF) optically-pumped atomic magnetometer. For example, OPM 150 maybe of a type that can be biased by a direct current (DC) bias magnetic field to be made sensitive to alternating magnetic fields at a certain frequency (e.g., at a Larmor precession frequency).

An AC magnetic field that is modulated to communicate information can be emitted (304). For example, modulator 120 may apply a modulation scheme (and optionally a coding scheme) to information from information source 130. The modulated information may be provided to AC magnetic field emitter 110. AC magnetic field emitter 110 may then emit a corresponding time-varying magnetic signal via (at least) magnetic waves 111.

An output of the OPM can be decoded to receive information communicated via the AC magnetic field (magnetic signal) (306). For example, the magnetic waves emitted by emitter 110 may pass through OPM 150. A time-varying pump or probe beam characteristic (e.g., light power or light polarization direction) that has passed through the OPM 150 vapor cell may then be demodulated by decoder 160 in order to receive the information 170 placed on the magnetic signal 111 emitted by emitter 110.

Communications and Location Link

Various embodiments allow for the derivation of signal and noise link budgets needed to evaluate the performance of various embodiments of the communication system. In accordance with some embodiments, each budget can have four parts: (A) signal generation and processing, (B) magnetic flux concentrators, (C) transmitter antenna, and (D) OPM sensor. In some embodiments, the resulting signal-to-noise (SNR) budget can be included in the channel capacity formulation of the link and evaluated for purposes of communications and location.

Signal Generation and Processing

The signal generation, transmission, and detection are always accompanied by noise. The most relevant sources of noise encountered in magnetic signal generation and detection include geomagnetic field fluctuations, artificial (created by human activity, such as electrical power grid noise at 50/60 Hz and corresponding harmonics, transformers, machinery), and noise created by conductive objects. Magnetic field data transmission includes many unique advantages including, but not limited to the full control of the spectral and temporal properties of the transmitter.

Geomagnetic field noise results from the time varying fluctuations of the ~50 µT geomagnetic field in the extremely low frequency (ELF, atmospheric science definition) band between 3 Hz and 3 kHz. This noise is on the order of 100 pT/Hz$^{1/2}$ at a given spatial point and is correlated over a range between 10 m and 1 km. The noise in this band is mostly due to the lightning activity in the neutral atmosphere and is of random nature. Artificial noise (e.g., created by human activity, such as electrical power grid noise at 50/60 Hz and corresponding harmonics, transformers, machinery), and its spectrum can be deterministic. While the magnitude of the power grid harmonics can exceed the level of the geomagnetic noise and be above 1 nT, its sources are often local and are of dipole nature. A third type of noise is created by conductive objects, such as the Johnson noise, which has a broadband frequency spectrum. It can be significant at the position of the sensor and comparable in magnitude to the noise sources described earlier when it comes from objects in immediate sensor proximity.

To systematically reduce the influence of such environmental noise sources, various embodiments provide for a signal structure that naturally filters the grid noise and averages other uncorrelated time fluctuations by using a BPSK modulation scheme. Here the carrier signal has its phase switch between 0° and 180° at the amplitude zero crossing by a pseudo-random sequence of m binary digits (chips) known as the "code" at the chip rate $v_c$. The value of m in decibels gives the processing gain. Some embodiments of the code can be designed to spread across the operational spectrum of the magnetometer and has notches of zero amplitude at all multiples of the grid fundamental frequency, thus working as a digital filter of the grid harmonics. This filter function can also averages uncorrelated time-domain noise via the two-point correlation function between the measured magnetometer signal and the pseudo-random code. This two-point correlation operation also produces a delta function in time that can be used to measure the time of arrival (or phase delay) between the source and the sensor. The amplitude of the delta function is proportional to m, whereas all other correlation peaks scale with $\overline{m}$.

Magnetic Flux Concentrators

Concentrators are passive elements that rely on the constitutive relations between the magnetic field $\vec{H}$ and the magnetic induction $\vec{B}$ for their operation. In the absence of any medium $\vec{B}=\mu_0\vec{H}$. In the magnetostatic approximation the presence of a medium contributes to the magnetic induction $\vec{B}$ through the magnetization $\vec{M}$, $\vec{B}=\mu_0(\vec{H}+\vec{M})$, where $\vec{M}=\chi\vec{H}$ and $\chi$ is the magnetic susceptibility tensor. In general, $\chi$ is of rank 1 (scalar) and uniform in space. Nonetheless, the exact spatial relationship between B and H is complicated by the dipole nature of M combined with the broadband boundaries of the concentrator medium and is quantified by the demagnetizing tensor D. Analytical expressions exist only for ellipsoids where D is diagonal and constant and for rectangular shapes. Numerically calculated tables for D are also available for cylinders.

The strength of the transmitted and received magnetic signals can be suitably amplified by means of flux concentrators with negligible noise penalties. The concentrator gain $G_c$ is thus a function of the relative magnetic permeability $\mu_r=(1+\chi)$ and the geometry of the material. In OPMs, $G_c$ can be as high as 20 with noise floors between 1 and 20 fT/Hz$^{1/2}$ within the 20 Hz-100 Hz bandwidth for ferrite-based concentrators. Note that concentrators are only effective if they can amplify signals to levels above the sensor equivalent input noise.

Transmitter Antenna

Because OPMs operate at frequencies below 1 kHz, electromagnetic fields at those frequencies have wavelengths greater than 300 km, and thus for a range r<1 km propagation effects are negligible. Therefore, Maxwell's equations in free space approximate to $\nabla\times H=\nabla\cdot H=0$. This is known as the magnetostatic approximation and allows a transmitter coil with p turns, area A, and carrying a current I to behave like a magnetic dipole having a magnetic moment of $\vec{\mu}=\mu_0 pIA\vec{n}$, where $\vec{n}$ is the vector normal to the coil area. This approximation holds if the coil size R is much smaller than the measurement range. The magnetic induction of a static dipole field is given by $$\vec{B} = \frac{3(\vec{\mu}\cdot\vec{r})\vec{r}}{r^5} - \frac{\vec{\mu}}{r^3}$$

where $\vec{r}$ is the vector connecting the coil geometric center to the magnetometer. The ratio of the magnetic induction amplitude at r normalized by its corresponding value at R is the gain due to the propagation medium, $$G_m = \frac{\cos\theta}{\left(\frac{r}{R}\right)^3},$$

where $$\cos\theta = \vec{\mu} \cdot \frac{\vec{r}}{\mu r} \text{ and } r/R \gg 1.$$

OPM Sensor

Various embodiments of the present technology can use optically pumped magnetometer (e.g., scalar OPMs, RF OPMs, pulsed OPMs, etc.) as a magnetic field sensor. For example, some embodiments can use a scalar magnetometer having a noise floor below 1 pT/Hz$^{1/2}$, which is better than a similar solid-state counterparts and is significantly below the ambient magnetic field noise in an unshielded environment. Some embodiments of the scalar magnetometers do not require calibration and could combine small size, weight, and power at a low cost.

The scalar magnetometers used in some embodiments can be all-optical, reducing possible effects from cross talk and allowing arrays of magnetometers to be built. The scalar magnetometer sensor in some embodiments can use optical resonance excitation (so-called Bell-Bloom configuration), and detection of light polarization rotation. While some embodiments can use amplitude light modulation and detection of light polarization rotation, the magnetometer can also work with frequency-modulated light and pump light transmission detection as well (at the expense of loss of sensitivity), reducing the device's complexity and power consumption.

Figure 4:
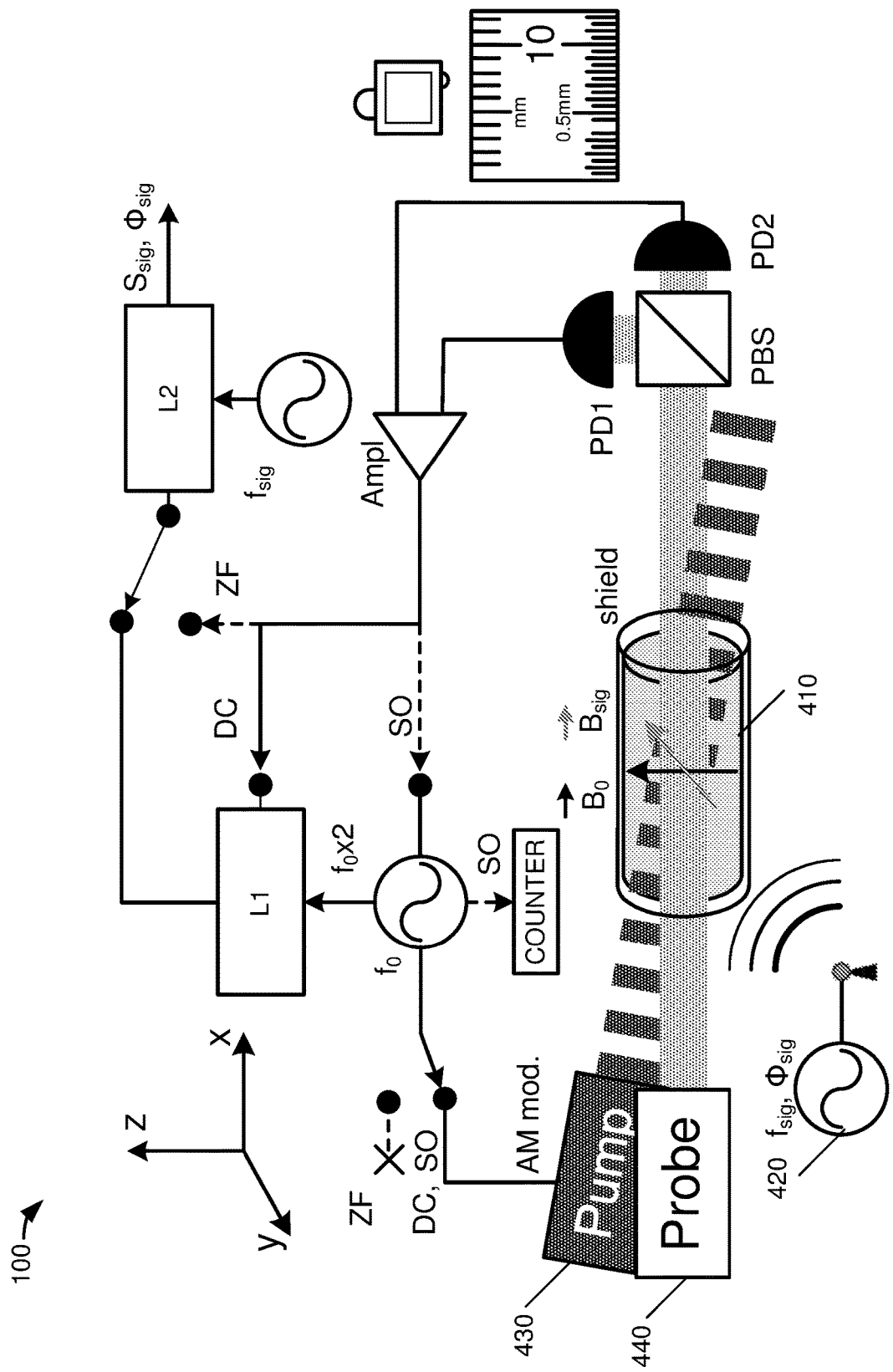
FIG. 4 is an example of a OPM setup that may be used in one or more embodiments of the present technology in accordance with one or more embodiments of the present technology.

Some embodiments of the magnetometer 400 are shown schematically in FIG. 4. In the embodiments illustrated in FIG. 4, the magnetometer 400 can use a glass vapor cell 410 with 33 mm$^3$ internal volume, filled with isotopically pure (Rubidium) Rb and 66.7 kPa (500 Torr) nitrogen acting as a buffer gas. The cell can be heated to 358° K (85° C.) to increase the Rb density. A static magnetic bias field $B_0$ is applied along the z axis, perpendicular to the cell's axis aligned along the x axis, with a pair of Zeeman coils positioned inside the magnetic shield. An external modulation field can be applied with a speaker coil 420 positioned outside the shield at a distance of 2 cm from the cell, with its axis aligned with the bias field direction.

Two or more laser beams (e.g., 780 nm laser beams) propagate through the cell, almost parallel to each other. The pump laser beam 430 propagates at a small angle with respect to the x axis in the xy-plane. It is circularly polarized and can be amplitude-modulated depending on the mode of operation. The amplitude modulation is accomplished by sending a train of RF pulses from a function generator to an RF amplifier, followed by an acousto-optic modulator. The beam optical frequency can be in resonance with the pressure-broadened $^{87}$Rb D$_2$ line in the vapor cell 410. The probe laser beam 440 propagates along the x axis. It can be linearly polarized, and its frequency can be detuned from the pressure-broadened $^{87}$Rb D$_2$ line in the vapor cell 410. The polarization of the far detuned probe laser beam exiting the cell can be detected with a balanced polarimeter.

The magnetometer can operate and is evaluated in three modes of operation: direct current (DC), zero-field (ZF), and self-oscillating (SO) modes. The DC and ZF modes could be used to detect magnetic field modulation (magnetic field signals). The SO mode is more useful in monitoring changes in the total magnetic field. The freedom to switch back and forth from a total field to a field component OPM sensor without any hardware modification could be used to gain additional information about the vector properties of the magnetic signal and the ambient magnetic field noise. The modes of operation are summarized in Table I.

TABLE I

| Mode | Band | Sensitivity (pT/Hz$^{1/2}$) | Measured Property | Transduction Type |
|---|---|---|---|---|
| DC | DC-1 kHz | 0.2 | $|\vec{B}_o + \vec{B}_{sig}|$ | T → V(DC) |
| ZF | DC-1 kHz | 0.2 | $|\vec{B}_{sig}|$ | T → V(AC) |
| SO | 10$^{-9}$-10$^{-6}$ T$^a$ | 2.0$^b$ | $|\vec{B}_o + \vec{B}_{sig}|$ | T → Hz |

Table I
$^a$The band means range of measured DC fields.
$^b$The sensitivity is expressed as magnetic field instability In the DC mode of operation (the nominal mode of operation used in this work), a static magnetic field $|B_0|=14$ μT is applied, corresponding to Larmor precession frequency of 98 kHz. The pump laser beam is modulated at half the Larmor frequency (a subharmonic modulation). The resonance between the light modulation and the Larmor precession causes modulation of the probe light polarization. The polarization modulation signal can be detected with a lock-in amplifier L1, referenced to the second harmonic of the modulation frequency.

The quadrature signal from the lock-in amplifier becomes sensitive to the difference between twice the modulation frequency and the atomic precession frequency caused by changes in the total magnetic field magnitude at the cell position. Thus, the output of the lock-in amplifier L1 contains information about the signal magnetic field vector B$_{sig}$, which adds to the static magnetic field vector B$_0$. The use of a second lock-in amplifier L2, phase-synchronized with the frequency of the transmitter's signal, outputs a signal with magnitude S$_{sig}$ and phase $\varphi_{sig}$, which are related to the transmitted field B$_{sig}$. The detected signal magnitude S$_{sig}$ depends on the mutual orientation of B$_0$ and B$_{sig}$ and the distance and attenuation between the transmitter and sensor.

In the ZF mode of operation, the magnitude of the static magnetic field at the magnetometer's position is set to zero. The pump laser beam is not modulated, and it creates atomic polarization along its direction (x axis). The probe polarization has a maximum rotation. The presence of the magnetic field B$_{sig}$ at the cell position causes the atomic polarization to precess away from the direction of the pump beam, which decreases the degree of atomic polarization in this direction. The rotation of the probe light polarization also changes. Thus, the polarimeter detects a zero-field resonance, and its output can be demodulated directly by lock-in amplifier L2 to obtain S$_{sig}$ and $\varphi_{sig}$. The detected signal magnitude S$_{sig}$ depends on the orientation and the magnitude of B$_{sig}$, and its orientation with respect to the pump/probe axis, and will be in general different from the signal magnitude detected in the DC mode due to the absence of a bias field B$_0$. The ZF field mode offers reduced experimental complexity, eliminating the need for the high dynamic range lock-in amplifier L1 and its reference. On the other hand, the total field magnitude in unshielded operation must be maintained below the magnetometer's resonance linewidth (<200 nT), which might require periodic implementation of a total field zeroing procedure. This mode can also be used to detect magnetic field modulation signals.

Figure 5:
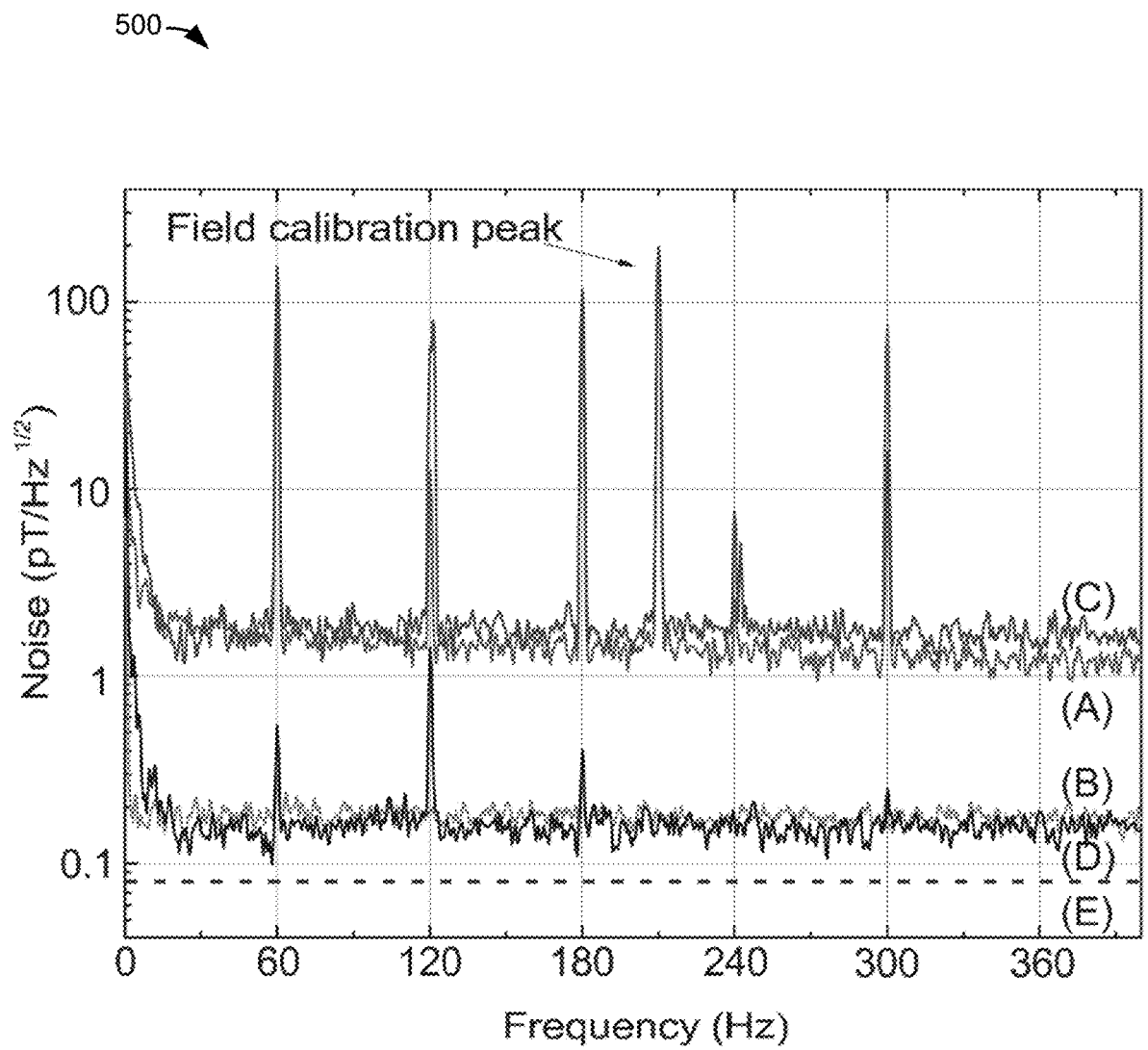
FIG. 5 is a plot illustrating OPM noise as a function of frequency in accordance with some embodiments of the present technology.

The magnetic field noise in DC and ZF modes measured by the magnetometer is plot 500 shown in FIG. 5. In FIG. 5, the following modes are illustrated: DC mode: (A)—on resonance, (B)—off-resonance; and ZF mode: (C)—on resonance, (D)—off-resonance. The dashed line (E) shows the measured level of electronics noise in the absence of light. The calculated probe light photon shot noise is at the same level.

In the DC mode, the values of modulation frequency on resonance and the gyromagnetic ratio were used to calibrate the magnetic field magnitude $|B_0|$ and to convert the lock-in amplifier L1 output voltage noise to magnetic field noise. The calibration was done by introducing a small deviation of the modulation frequency away from resonance (which is equivalent to a change of the bias field away from the resonance) and observing the voltage change at the lock-in amplifier L1 output. When the bias field magnitude $|B_0|$ is significantly different from the resonance, the measured noise provides information about the magnetometer noise floor. The on-resonance curve (A) shows the ambient-dominated magnetic field noise at 2 $pT/Hz^{1/2}$ level. The magnetic noise due to the power lines causes the resonances at 60 Hz and its harmonics.

In the ZF mode, the bias magnetic field and the pump beam modulation are turned off. The power in the pump and probe beams was optimized to increase the magnetometer sensitivity. An external AC magnetic test field at 210 Hz frequency was applied along the direction of the bias field using the speaker coil. The calibration field is orthogonal to the x axis, and has the same amplitude in both DC and ZF modes. The 210 Hz calibration signal is only visible in the on-resonance case (A and C). The calibration field was used to determine the sensitivity of the magnetometer in ZF mode, in the absence of spin precession. The voltage noise at the polarimeter output was converted to magnetic field noise using the known calibration field magnitude. The on-resonance curve (C) shows agreement with the corresponding DC mode curve (A) except for the roll-off at higher frequencies, due to the time constant of 100 µs of the lock-in amplifier L1 (used only in the DC mode).

To study the limit of the magnetometer sensitivity, the bias magnetic field was detuned far from resonance, while the modulation frequency was kept the same. The off-resonant curves (B and D) show a magnetometer noise floor limit significantly below 1 $pT/Hz^{1/2}$ for both configurations. The expected magnetometer noise floors are significantly below the ambient magnetic field noise level of 2 $pT/Hz^{1/2}$, indicating that magnetic data transmission is not limited by the magnetometer even in the presence of a magnetic shield. The dashed line (E) represents the measured electronics noise in the absence of light. The calculated photon shot noise due to the probe beam is at the same level. Previous results indicate that the magnetometer noise floor should reach 200 $fT/Hz^{1/2}$ in a cell of this volume. A noise floor of 100 $fT/Hz^{1/2}$ in an unshielded environment has already been demonstrated, and this limit has been used in the channel capacity calculations below as an OPM baseline.

In the SO mode of operation, the reference for the amplitude modulation is phase-locked to the rectified polarimeter output. Changes of the magnetic field magnitude $|B_0|$ lead to a change of the precession frequency and thus to a change of the pump beam modulation frequency. The modulation frequency becomes phase-locked to the precession frequency and thus to the magnetic field magnitude $|B_0|$. A frequency counter is used to calibrate the absolute value of $|B_0|$ using the gyromagnetic ratio $\gamma = 2\pi \times 7$ Hz/nT for $^{87}$Rb. The output of the polarimeter is rectified using a fast comparator and is used to trigger the amplitude modulation of the pump laser beam after an appropriate phase delay. The function generator can be set up to provide only one pump pulse during several Larmor precession periods, which fulfills the condition for pumping at a subharmonic of the Larmor precession frequency. In the described case, the function generator provided a pump pulse each two Larmor precession periods. The polarimeter signal, containing a frequency component corresponding to the Larmor precession period, was counted with a frequency counter with a gate time of 50 ms.

Figure 6:
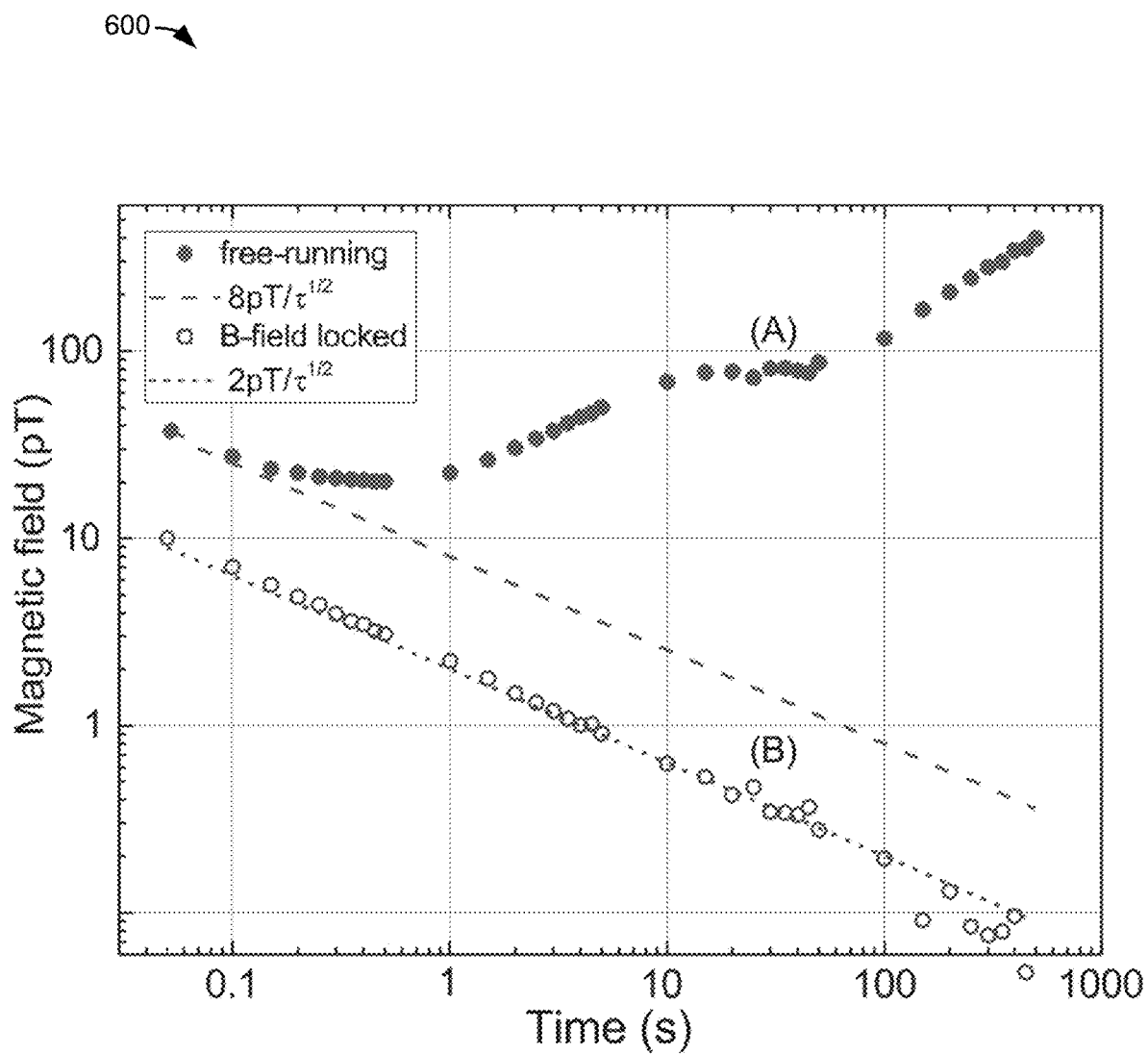
FIG. 6 is a plot of measured magnetic field instability in self-oscillating (SO) mode as a function of measurement time in accordance with various embodiments of the present technology.

FIG. 6 shows a plot 600 the results of magnetic field instability measurements performed in SO mode, expressed as an Allan deviation. A measurement of the ambient field at the magnetometer position (FIG. 6, filled circles) shows field instability below 8 $pT/\tau^{1/2}$ (FIG. 6, long-dashed curve). This is expected, considering that the SO magnetometer is sensitive to the integrated ambient magnetic field noise spectrum, which is above 2 $pT/Hz^{1/2}$ and contains 60 Hz harmonics above 100 $pT/Hz^{1/2}$. To approach the intrinsic magnetometer sensitivity, a phase-locked loop was used to lock the precession frequency to a frequency reference by controlling the magnitude of the bias magnetic field $|B_0|$. The precession frequency at the output of the polarimeter was compared with a stable 98 kHz signal referencing the lock-in amplifier L1. The L1 output was used to control the current through the bias field coils and the value of $|B_0|$, locking the Larmor precession frequency to 98 kHz. The phase-locked loop suppressed the magnetic field noise in the 100 Hz bandwidth, reducing the magnetic field measurement instability to 2 $pT/Hz^{1/2}$ (FIG. 6, short-dashed curve), which is consistent with the ambient magnetic field noise floor from the 60 Hz harmonics.

Single Channel Capacity

The signal S and noise N at the sensor, measured here in units of Tesla, can now be estimated based on the gain factors at the antenna and OPM via flux concentrators and through the propagating media. In conjunction with the signal processing gain represented by the used bandwidth BW, the communication or location ability of the link can be determined via the channel capacity, $$C = BW \log_2\left(1 + \left(\frac{S}{N}\right)^2\right),$$

where the signal amplitude is $S = G_c^{Tx} * G_m * G_c^{Rx} * Tx + Rx$ and the noise amplitude is $N = G_c^{Tx} * G_m * G_c^{Rx} * N_{Tx} + N_{Rx}$, both at 1 Hz bandwidth.

Figure 7:
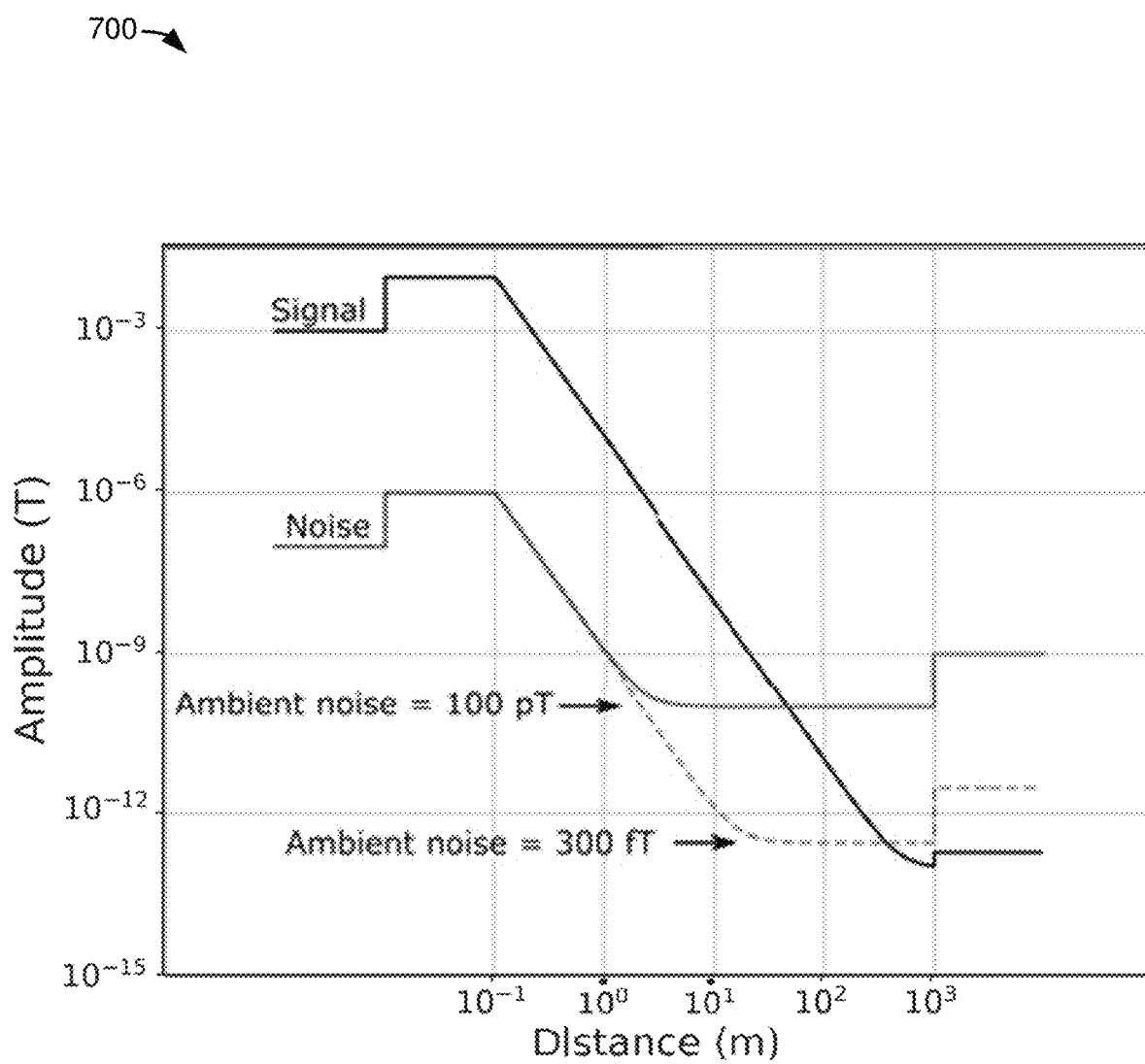
FIG. 7 is a plot illustrating an example of a communication link calculation analysis for the magnetic field signal and noise at 1 Hz bandwidth in accordance with one or more embodiments of the present technology.

Here Rx is the baseline of the OPM, and $N_{Rx}$ is the ambient noise at the sensor. The S/N term is squared to conform with the units of power normally used to calculate channel capacity. Typical numbers are Tx=1 mT, Rx=100 fT, $N_{Rx}$=100 pT, $G_c$=10, R=0.1 m, θ=0 assuming the transmitter and sensor can be aligned independently using the Earth's magnetic field direction as a reference. FIG. 7 shows a graphical representation 700 of the above parameters. The dashed curve represents a hypothetical situation where the ambient noise is at $N_{Rx}$=300 fT, which could possibly be achieved by using a combination of OPM sensors with $N_{Rx}$=100 fT baseline. To calculate the maximum channel capacity at the sensor, a BW=1 kHz OPM bandwidth was used.

Results

Figure 8:
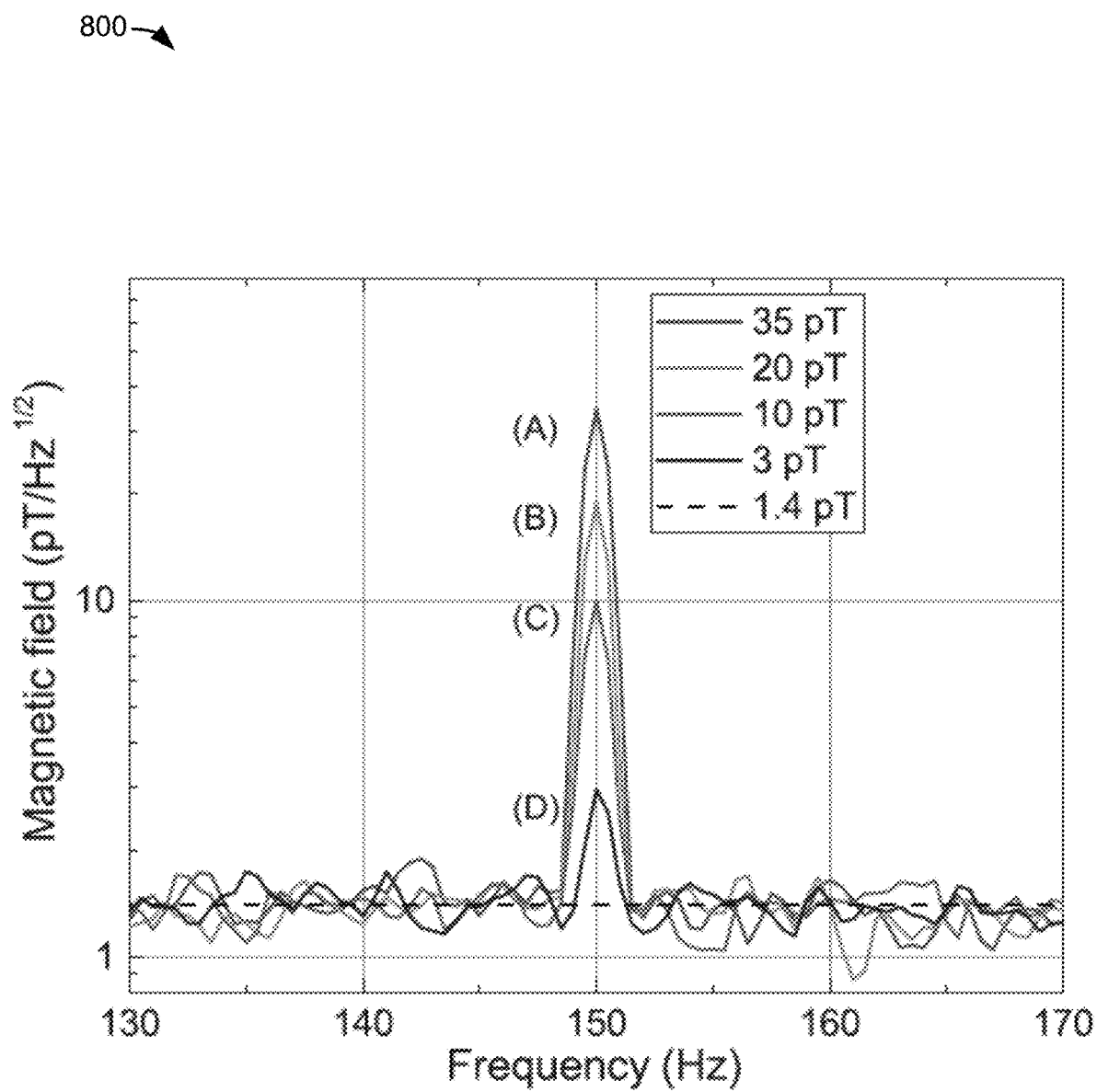
FIG. 8 is a plot illustrating an example of an OPM sensor output spectrum in the presence of a magnetic signal with 150 Hz frequency in accordance with some embodiments of the present technology.

To evaluate the OPM as a positioning device, a proof-of-principle evaluation of the scalar magnetometer-based OPM sensor for signal phase delay measurements was performed in the DC mode of operation, with a bias field of 14 µT. A single-tone magnetic signal at 150 Hz was created with the speaker coil. The signal varied in magnitude. The magnetic field spectrum (the output signal of L1 converted to magnetic field magnitude) is shown in FIG. 8, with the lock-in amplifier L1 time constant of 100 µs. The measured modulation magnitudes and signal-to-noise ratios (SNR) are given in the second and third column of Table II, respectively.

TABLE II

| Cases | Magnitude (pT) | SNR | Instability $\left(\frac{mrad}{\sqrt{\tau}}\right)$ | Instability $\left(\frac{mrad}{\sqrt{\tau}}\right)^a$ | Instability $\left(\frac{mrad}{\sqrt{\tau}}\right)^b$ |
|---|---|---|---|---|---|
| A | 35 | 25 | 30 | 5 | 2 |
| B | 20 | 20 | 40 | 7 | 3 |
| C | 10 | 14 | 80 | 15 | 7 |
| D | 3 | 2 | 1080 | 197 | 88 |

[a] Using BPSK with chip rate of 30 Hz.
[b] Using BPSK with chip rate of 150 Hz

A phase-sensitive detection at the 150 Hz modulation frequency was performed with the lock-in amplifier L2 with a time constant of 300 ms. The phase instability of the transmitted signal reference and the L2 reference was much below the measured phase instability of the detected 150 Hz tone, which was determined by the limited SNR. The measured phase instability at 1 s is given in the fourth column of Table II.

Figure 9:
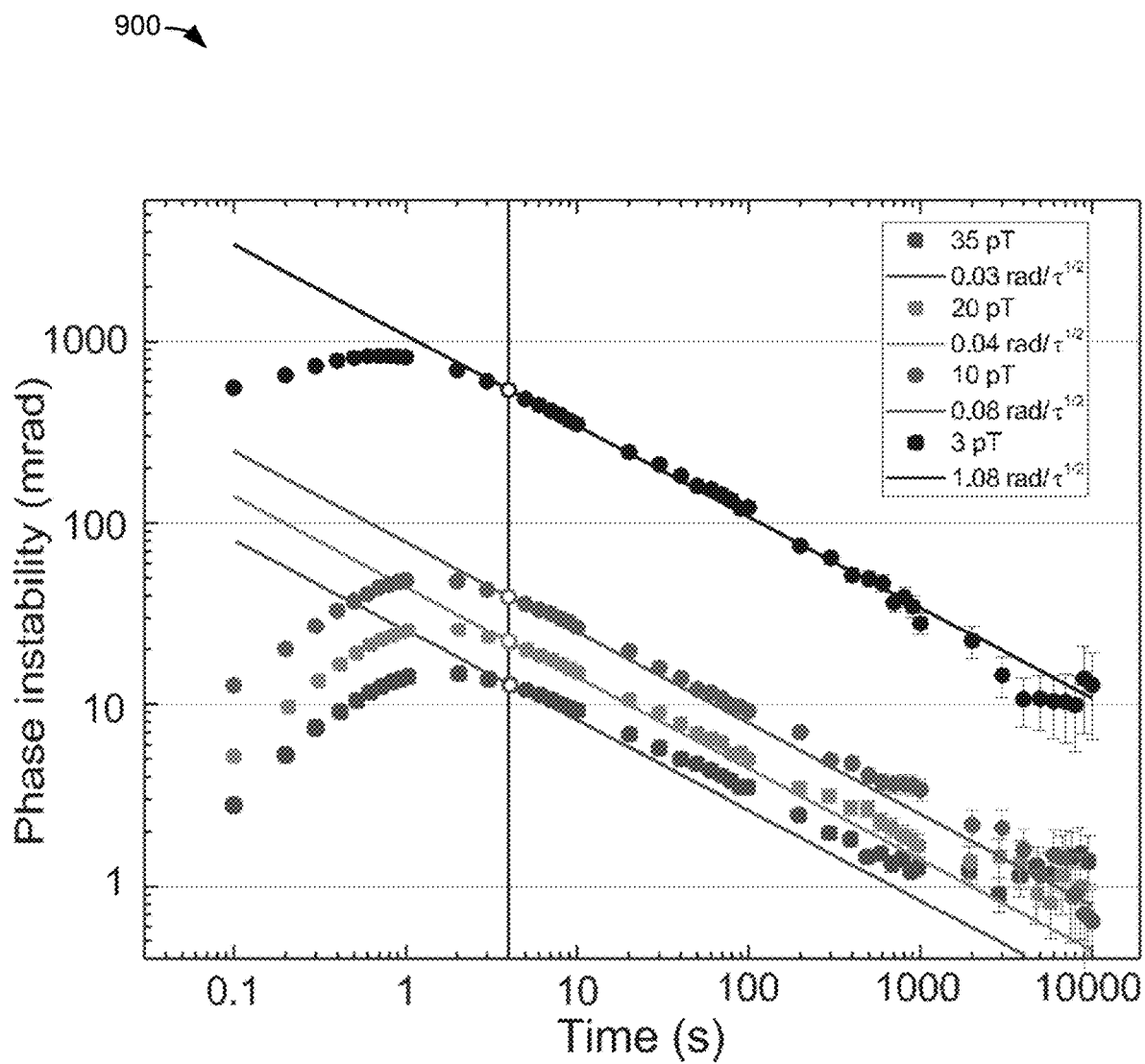
FIG. 9 is a plot illustrating an example of measured phase instability of the detected signals shown in FIG. 8 versus measurement time.

The 150 Hz signal phase at each signal magnitude was monitored over ~50,000 s. The phase instability over measurement time, expressed as Allan deviation, is shown in FIG. 9 with solid symbols. Due to the time constant of L2, the instability decreases below 1 s. The solid lines represent white noise-dominated measurements, scaling as $1/\tau^{1/2}$. They were calculated using the measured instability values at 4 s (FIG. 9, open symbols). The instabilities at 4 s are a compromise between values at short times, affected by the L2 time constant, and the long-term drifts apparent at times longer than 10 s.

The corresponding instabilities at 1 s are given in the fourth column of Table II. The averaging period necessary to reach a given measurement accuracy can be calculated from the instabilities at 1 s. For the presented measurements, no attempt has been made to control experimental parameters such as laser frequencies, powers, or ambient magnetic field, and the deviation from the expected $1/\tau^{1/2}$ dependence is due in part to drifts in the parameters of the free-running OPM. It is worth mentioning that in certain cases, the phase instability follows $1/\tau^{1/2}$ dependence up to 10,000 s, reaching reliably the 1 mrad level even without active parameter control.

To evaluate the OPM as a communication device, and to utilize the sensor bandwidth, detection of phase-modulated signals was also performed by the BPSK modulation scheme, as discussed above. First, a carrier frequency $v_0$=210 Hz [case (A)] modulated with a chip rate $v_c$=30 Hz. This was done intentionally to avoid 60 Hz power grid frequency and its harmonics. Second, a carrier frequency $v_0$=180 Hz was modulated with a maximum chip rate of $v_c$=180 Hz to maximize the use of the sensor bandwidth [case (B)]. Both codes lasted 20 s, which creates notches at multiples of 0.05 Hz, thus also suppressing the power grid harmonics.

Figure 10:
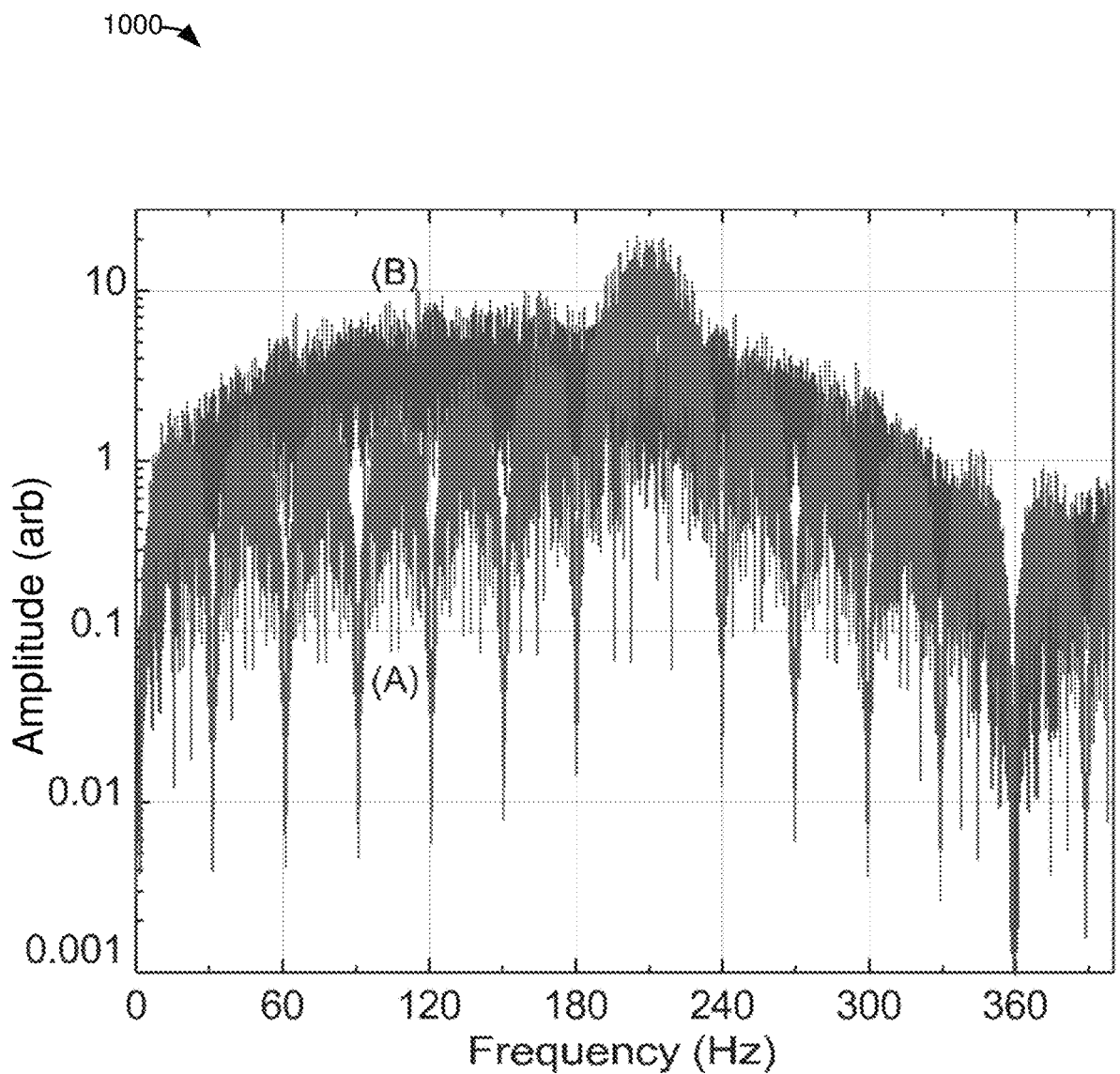
FIG. 10 is a plot illustrating an example of a BPSK modulation signal spectra that may be used in one or more embodiments of the present technology.
Figure 11:
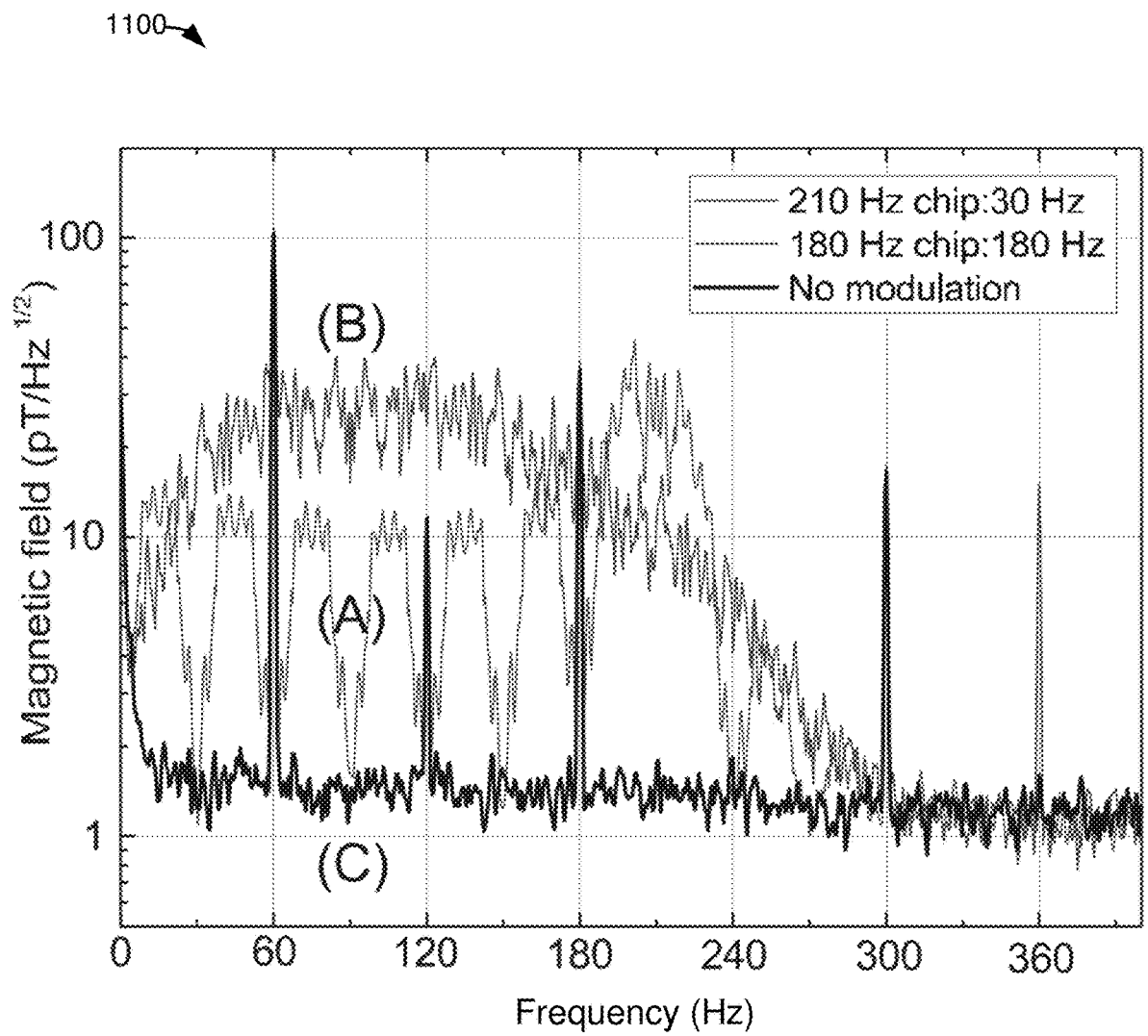
FIG. 11 is a plot illustrating an example of a sensor output spectrum in the presence of BPSK signal shown in FIG. 10 in accordance with some embodiments of the present technology.

FIG. 10 shows a plot 1000 of the two BPSK modulation signal spectra used to excite the transmitter. FIG. 10 also shows how the BPSK modulation uses the available spectrum of the sensor. The spectrum of the detected BPSK modulated magnetic field signals is shown in plot 1100 in FIG. 11. The shield attenuation, which increases with frequency, and the OPM sensor bandwidth limit the spectrum amplitudes at frequencies above 300 Hz.

Figure 12:
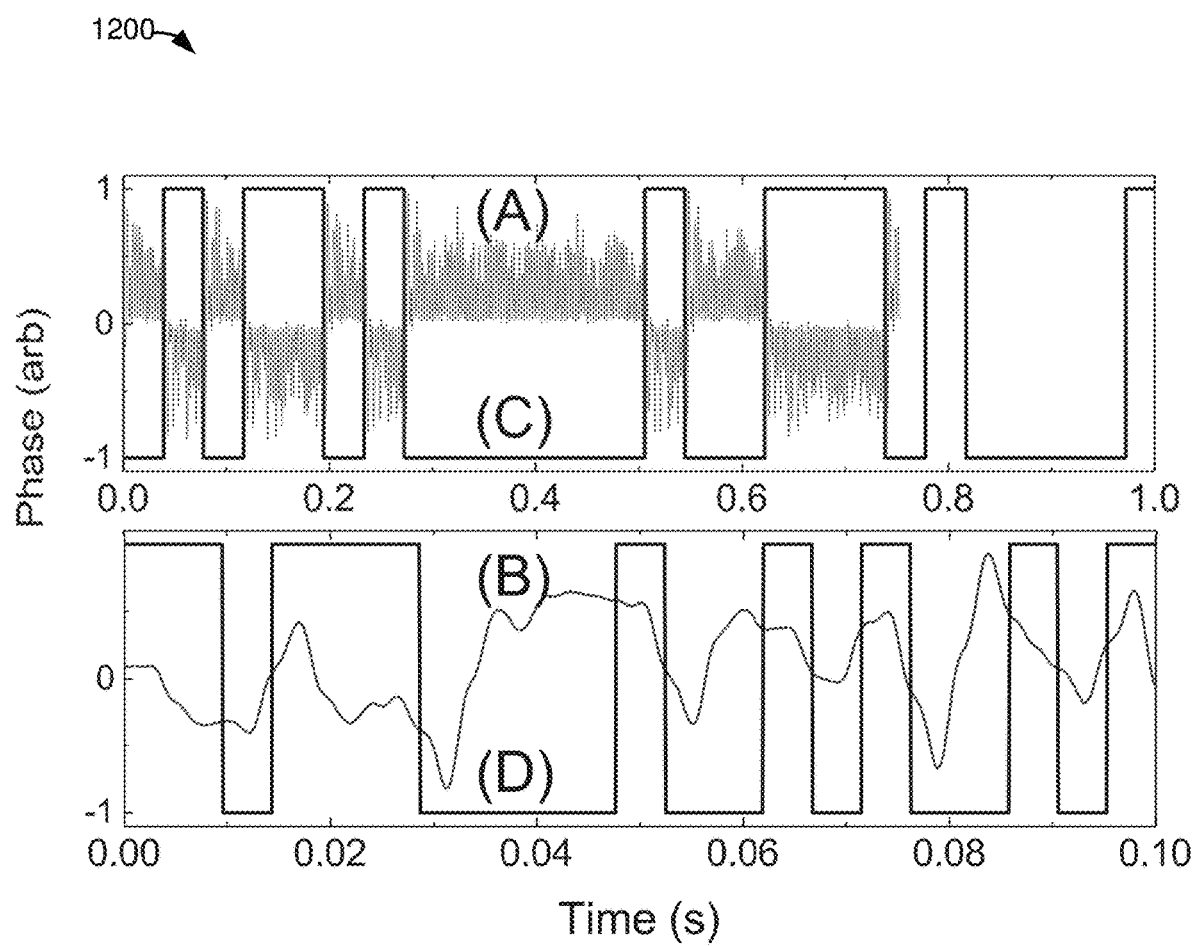
FIG. 12 is a plot illustrating an example of a time dependence of the detected magnetic signal phase in various embodiments of the present technology.

The signals were demodulated using L2, referenced to $v_0$. The phase detection signal is shown in FIG. 12. In case (A), the beat signal between the closest 60 Hz harmonics and the L2 reference is visible as oscillations between consecutive phase flips. In case (B), as L2 is referenced to a 60 Hz harmonic, no beat is apparent in the spectrum. The phase flips in case (B) happen more often than in case (A) due to the higher chip rate $v_c$, as indicated by the different horizontal span.

Figure 13:
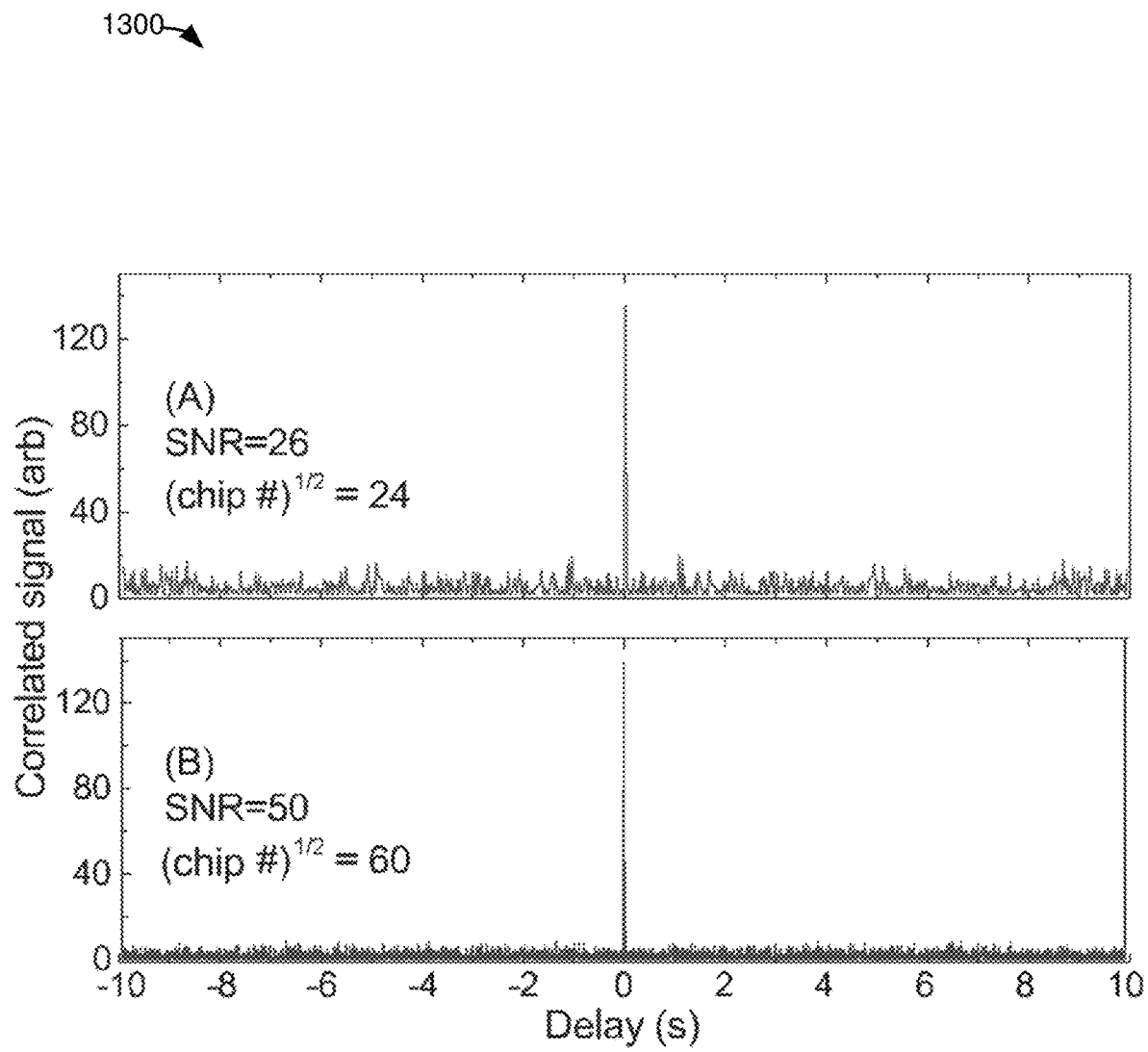
FIG. 13 is a plot illustrating an example of the correlation between the demodulated signal and the transmitted BPSK code as a function of the time delay between the signal and the code in one or more embodiments of the present technology.

The response of the sensor to the BPSK-modulated signal was correlated with the original code. The correlation results as a function of the time delay between signal and code are shown in FIG. 13. The measured ratios between the correlation peak and the standard deviation of the background noise, and the square root of the number of chips m, are 26 and 24 for case (A) and 50 and 60 for case (B), showing only a slight degradation of the measured SNR for case (B).

The BPSK-modulated signal in case (A) has both $v_0$ and $v_c$ correspond to the power line harmonics. At the output of lock-in amplifier L2, the closest power line harmonics cause demodulated signals at frequencies of 60 Hz or higher, which are rejected by the integration time of L2 of 300 ms. In case (B), the BPSK-modulated signal has limited support at the power line harmonics. This can clearly be seen in FIGS. 10 and 11 [curves (B)]. Since the signal correlation is done by the multiplication of the code and detected signal spectra, this limited support leads to a natural suppression of the power line harmonics in the correlated signal. Both modulation schemes offer the usage of significant part of the OPM sensor bandwidth, with detected signals largely unaffected by the power line harmonics.

The processing gain over a single-tone signal, when the BPSK-modulated signal is used, is given by $10 \log_{10} \sqrt{v_c}$ at 1 s. Processing gain reduces the uncertainty of a phase or time delay determination to a fractional chip duration. The projected instabilities using BRPK modulation are given in columns 5 (chip rate 30 Hz) and 6 (chip rate of 180 Hz) of Table II, based on the measured single-tone instabilities at 1 s given in column 4 of the same table.

DISCUSSION

The graphical representation of the link calculations shown in FIG. 7 indicates the main contributions in the performance of the OPM-based signal transmission of some embodiments. Some embodiments allow for applications for OPM communications system in communications and location.

For communications, the channel capacity is the best performance metric since it directly measures the bit rate for a given range. The link budget was described above and shown in FIG. 7. With the ambient noise determined sensor baseline 100 pT/Hz$^{1/2}$ and SNR=2 at the sensor (corresponding to the last row of Table II), the channel capacity is about 2.3 bits/s, achieved at a range of 37 m at 1 Hz bandwidth. For chip rates (or bandwidth) of 30 Hz and 180 Hz, the channel capacity is correspondingly 70 bits/s and 418 bits/s. With a sensor baseline of 300 fT/Hz$^{1/2}$ (budgeting for ambient noise cancellation using more than one OPM with 100 fT/Hz$^{1/2}$ baseline) as shown in FIG. 7 these channel capacities would be obtained at 320 m range.

For location, the phase noise of the received signal is the relevant parameter since it is related to the uncertainty in the measured phase delay. In vacuum, the phase delay uncertainty has to be less than 10 ns for a corresponding spatial uncertainty of less than 3 m. In media other than vacuum, this uncertainty decreases proportionally with the medium index of refraction. The phase noise measured with the OPM sensor and shown in FIG. 9 is dominated by the poor SNR, with the phase noise at 1 s tabulated in Table II.

The phase noise of the transmitter and sensor frequency references can be neglected at the measured noise levels. Using the last row of Table II, single-tone frequency of 150 Hz and SNR=2, the phase noise uncertainty of 1.08 rad (time delay uncertainty of 1.14 ms) at $\tau=1$ s is reduced by averaging down to 10 mrad (11.4 μs) at an integration time of 10,000 s (FIG. 9). At SNR=25, the same phase delay uncertainty is reached in 10 s and is 1.1 μs at 1000 s, after which the phase noise becomes independent of the averaging time due to drifts in the free-running OPM parameters.

To perform time averaging in real applications, digital signal generation and processing utilize the available bandwidth via BPSK modulation schemes. Using the BPSK processing gain (corresponding to an improvement factor of $\sqrt{v_c}$) with $v_c=150$ Hz for SNR=2, the time delay uncertainty would be reduced to ~1 μs at 10,000 s. Therefore, to obtain 10 ns of phase delay uncertainty in 1 s with a sensor baseline of 100 pT/Hz$^{1/2}$ (the ambient noise), the range increases to 2.3 m in vacuum. However, with a sensor baseline of 300 fT/Hz$^{1/2}$ (the OPM baseline), the range increases to 16 m.

The signals measured by OPMs used in various embodiments can penetrate media that displays orders of magnitude more loss at higher frequencies at the cost of lower bandwidth or more integration time. Therefore, comparisons with higher capacity channels or spatial location uncertainties should consider the propagation through conductive media as water, rock, snow, and even metals. Improvements in the link budget are possible by the reduction of the ambient noise and the OPM baseline, use of stronger field sources, and increasing the OPM operational bandwidth.

In accordance with various embodiments, various techniques for magnetic field signal generation, noise rejection, or sensor sensitivity/bandwidth improvement can be applied. Permanent $ND_2Fe_{14}B$ neodymium magnets can produce dc magnetic inductions of the order of 1 T and can be mounted on actuators such as audio speakers or rotating platforms to produce signals with 1 kHz bandwidth. The use of concentrators at the transmitter end in beneficial provided that the concentrator does not degrade the transmitter signal-to-noise ratio. However, the use of concentrators on the sensor end can enhance performance only if the OPM baseline is below the concentrated received signal and above the concentrated ambient noise, otherwise the ambient noise will be enhanced more the received signal. Arguably, the most consequential contribution to the received signal reduction is the normalized range r/R where a change by a factor of two corresponds to a change by a factor of eight in signal strength.

Existing techniques for magnetic field noise rejection exploit the spatial, spectral, and temporal properties of the noise sources. The most common noise cancellation technique is based on spatial noise rejection. The signal and noise could be spatially separated using sensor arrays to cancel the magnetic field noise from distant and local sources. For applications where the signal source is local, shielding and gradiometer techniques work best, and common-mode rejection ratios above 100 have been demonstrated.

For data transfer at a distance, this technique is not suitable, since gradiometers will have reduced sensitivity to a signal from a source at a distance large compared to the gradiometer baseline. Techniques for reducing the local noise when the signal source is remote are more appropriate, as it has been successfully demonstrated, for example, in space magnetometry. Using arrays of sensors could allow spatial noise rejection and could provide information about direction, distance, magnitude, and orientation of a local dipole source.

With respect to local noise sources such as power lines, transformers, machinery, or thermal Johnson noise, care must be taken to position the sensor away from such sources. Various embodiments can use the noise's spectral and temporal properties and signal frequencies where no significant noise components exist. The complete freedom to choose the properties of an artificially created signal allows the application of a multitude of techniques developed for phase detection, time and frequency dissemination, and communications. Signal properties in the time domain can be used to suppress uncorrelated noise. Using digital signal processing techniques, various embodiments can filter out and/or average noise components in the spectral domain.

The fundamental sensitivity of scalar optically pumped magnetometers based on alkali atoms is estimated to be at 1 fT/Hz$^{1/2}$ cm$^3$ and even lower as has been demonstrated using pulsed regime of operation and quantum non-demolition detection with $^{87}$Rb. The measured sensitivity of our OPM corresponds to 40 fT/Hz$^{1/2}$ cm$^3$, showing that further improvement of the OPM sensor baseline is possible.

It is possible that even with noise suppression, the residual ambient noise will be higher than the OPM sensor baseline. In this case, the sensitivity of OPMs can be reduced to match the residual environmental noise levels by increasing the magnetometer bandwidth and thus the channel capacity.

CONCLUSIONS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "couples," or any variant thereof means any connection or coupling, either direct or indirect, between two or more elements; the coupling or connection between the elements can be physical, logical or a combination thereof. Additionally, the words "herein," "above," "below," and words of similar import, when used in this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The Elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited in a particular format (e.g., system, method, computer-readable medium claim, etc.), other aspects may likewise be embodied in these formats, or in other forms, such as being embodied in a means-plus-function claim. Any claims intended to be treated under 35 U.S.C. § 112(f) will begin with the words "means for," but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A system comprising:
    an optically pumped magnetometer (OPM) to sense a modulated magnetic field, wherein the modulated magnetic field includes encoded information;
    a modulator communicably coupled to the OPM and configured to decode an output of the OPM to identify the encoded information transmitted via the modulated magnetic field; and
    a processor communicably coupled to the OPM and configured to cause the OPM to switch back and forth from a total field, to a field component, OPM sensor.

2. The system of claim 1, wherein the processor is further configured to identify vector properties of the modulated magnetic field and ambient magnetic field noise.

3. The system of claim 1, wherein the OPM includes concentrators to enhance performance only when an OPM baseline is below a concentrated received signal and above a concentrated ambient noise.

4. The system of claim 1, further comprising a digital signal processor that is configured to filter out and/or average noise components in a spectral domain of the modulated magnetic field as represented by the output of the OPM.

5. The system of claim 1, wherein the modulated magnetic field is phase modulated, polarization modulated, amplitude modulated, or frequency modulated, either by analog or digital techniques.

6. The system of claim 1, further comprising means operatively coupled to the OPM to bias the OPM by a direct current magnetic field.

7. A method of wirelessly communicating information, comprising:
    enabling an optically pumped magnetometer (OPM) to sense a modulated magnetic field, wherein the modulated magnetic field includes encoded information;
    switching the OPM back and forth from a total field, to a field component, OPM sensor;
    identifying, based on the switching, vector properties of the modulated magnetic field and ambient magnetic field noise; and
    decoding an output of the OPM to decode the encoded information transmitted via the modulated magnetic field.

8. The method of claim 7, wherein the modulated magnetic field is phase modulated, polarization modulated, amplitude modulated, or frequency modulated, either by analog or digital means.

9. The method of claim 7, wherein the modulated magnetic field is modulated with a binary phase-shift keying scheme.

10. The method of claim 9, wherein the modulated magnetic field is further modulated with a pseudo-random code at a chip rate.

11. The method of claim 10, wherein the pseudo-random code is selected to have zero amplitude frequency notches at an interference frequency.

12. The method of claim 11, wherein the interference frequency is a power grid frequency at: 60 Hertz, or 50 Hertz.

13. The method of claim 7, further comprising biasing the OPM by a direct current magnetic field.

14. A communication system comprising:
    a transmitter to transmit a modulated magnetic field with encoded information; and
    a receiver comprising:
        an optically pumped magnetometer (OPM) to detect the modulated magnetic field transmitted from the transmitter, wherein the OPM translates the modulated magnetic field into an electrical signal representing the sensed signal,
        wherein the receiver causes the OPM to switch back and forth from a total field, to a field component, OPM sensor to identify vector properties of the modulated magnetic field and ambient magnetic field noise; and
        a decoder configured to receive the electrical signal from the OPM and decode the encoded information.

15. The communication system of claim 14, wherein the modulated magnetic field generated by the transmitter is polarization modulated, amplitude modulated, or frequency modulated, by either analog or digital means.

16. The communication system of claim 14, wherein the modulated magnetic field generated by the transmitter is modulated with a binary phase-shift keying scheme.

17. The communication system of claim 16, wherein the modulated magnetic field generated by the transmitter is further modulated with a pseudo-random code at a chip rate.

18. The communication system of claim 17, wherein the pseudo-random code is selected to have zero amplitude frequency notches at one or more interference frequencies.

19. The communication system of claim 14, wherein the OPM includes concentrators to enhance performance only when an OPM baseline is below a concentrated received signal and above a concentrated ambient noise.

20. The communication system of claim 14, wherein the receiver includes a digital signal processor to filter out and/or average noise components in a spectral domain of the modulated magnetic field as represented by the electrical signal from the OPM.

\* \* \* \* \*